United States Patent
Sugahara

(10) Patent No.: US 8,435,440 B2
(45) Date of Patent: May 7, 2013

(54) METHOD FOR FORMING A CONDUCTIVE PATTERN AND A WIRED BOARD

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 776 days.

(21) Appl. No.: 11/410,254

(22) Filed: Apr. 25, 2006

(65) Prior Publication Data

US 2006/0237229 A1    Oct. 26, 2006

(30) Foreign Application Priority Data

Apr. 25, 2005   (JP) ................................ 2005-126582

(51) Int. Cl.
*H05K 3/10* (2006.01)

(52) U.S. Cl.
USPC ............................ 264/619; 264/614; 264/482

(58) Field of Classification Search .................. 264/614, 264/619, 482
See application file for complete search history.

(56) References Cited

U.S. PATENT DOCUMENTS

| | | | |
|---|---|---|---|
| 4,893,216 A | | 1/1990 | Hagner |
| 5,194,694 A | * | 3/1993 | Hendel et al. ................. 174/539 |
| 5,250,319 A | | 10/1993 | Ohsako |
| 6,973,710 B2 | | 12/2005 | Kiguchi et al. |
| 2002/0047880 A1 | | 4/2002 | Kitahara |
| 2003/0016274 A1 | | 1/2003 | Kitahara |
| 2003/0024103 A1 | * | 2/2003 | Kiguchi et al. ................. 29/601 |
| 2005/0022374 A1 | | 2/2005 | Hirai et al. |
| 2005/0043186 A1 | | 2/2005 | Maekawa et al. |
| 2005/0158456 A1 | | 7/2005 | Kiguchi et al. |
| 2006/0158482 A1 | | 7/2006 | Nakamura et al. |
| 2006/0286704 A1 | | 12/2006 | Hirai et al. |
| 2007/0098883 A1 | | 5/2007 | Itoh et al. |

FOREIGN PATENT DOCUMENTS

| | | |
|---|---|---|
| EP | 0358332 A2 | 3/1990 |
| JP | S58-068057 U | 5/1983 |
| JP | S62-216393 A | 9/1987 |
| JP | H03-003292 A | 1/1991 |
| JP | H03-218691 A | 9/1991 |
| JP | H04-063487 A | 2/1992 |
| JP | H09-290194 A | 11/1997 |
| JP | H11274671 | 10/1999 |
| JP | 2002-261048 A | 9/2002 |

(Continued)

OTHER PUBLICATIONS

Viggiano, "Considerations in High-Speed, Commercial Quality Ink-Jet Printing", 2000, Table 2, accessed at http://www.acolyte-color.com/papers/.*

(Continued)

*Primary Examiner* — Philip Tucker
*Assistant Examiner* — Alison Hindenlang
(74) *Attorney, Agent, or Firm* — Baker Botts L.L.P.

(57) ABSTRACT

A groove and a recess are formed on one surface of a base material, the recess being communicated with the groove and having a width and a length longer than a width of the groove. After that, liquid droplets are landed on the recess to charge a liquid into the groove communicated with the recess. Further, the liquid charged into the groove is solidified. Accordingly, the liquid can be charged into the groove having the narrow width, by merely landing the liquid droplets on the recess having a large areal size. Therefore, a fine pattern can be easily formed on the base material.

20 Claims, 18 Drawing Sheets

FOREIGN PATENT DOCUMENTS

| | | |
|---|---|---|
| JP | 2002261048 | 9/2002 |
| JP | 2002-290029 A | 10/2002 |
| JP | 2002-353595 A | 12/2002 |
| JP | 2002-361868 A | 12/2002 |
| JP | 2003-124210 A | 4/2003 |
| JP | 2003-124213 A | 4/2003 |
| JP | 2003-188497 A | 7/2003 |
| JP | 2003-318526 A | 11/2003 |
| JP | 2003-318542 A | 11/2003 |
| JP | 2004-128387 A | 4/2004 |
| JP | 2004-152934 A | 5/2004 |
| JP | 2004-221387 A | 8/2004 |
| JP | 2004-228375 A | 8/2004 |
| JP | 2004356255 | 12/2004 |
| JP | 2005-012181 A | 1/2005 |
| JP | 2005-032943 A | 2/2005 |
| JP | 2005-093224 A | 4/2005 |
| WO | 2004/096451 A1 | 11/2004 |
| WO | 2004-097915 A | 11/2004 |
| WO | 2005-025787 A1 | 3/2005 |

OTHER PUBLICATIONS

European Patent Office, European Search Report of European Patent Appl'n No. 06008452.2-1235, mailed Feb. 28, 2008.

Japan Patent Office; Notice of Reasons for Rejection of Patent Application No. JP 2006-117549, mailed Feb. 1, 2011. (counterpart to above-captioned U.S. patent application).

European Patent Office, Office Action for European Patent Application No. 06008452.2 (counterpart European patent application), dated Nov. 21, 2012.

Japan Patent Office, Notice of Reasons for Rejection for Japanese Patent Application No. 2006-117549 (counterpart to above-captioned patent application), mailed Dec. 13, 2011.

Partial English Translation of Japanese Patent Application Publication No. 2004-221387. (Applicat previously submitted a copy of Japanese Patent Application Publication No. 2004-221387, included an English language Abstract, with a supplemental Information Disclosure Statement filed in the U.S. Patent and Trademark Office on Mar. 28, 2011).

Japan Patent Office, Notice of Decision of Refusal for Japanese Patent Application No. 2006-117549 (counterpart to above-captioned patent application), mailed Feb. 28, 2012.

Japan Patent Office, Notice of Reasons for Rejection for Japanese Patent Application No. 2011-074324 (counterpart Japanese patent application), mailed Jul. 10, 2012.

Japan Patent Office, Notice of Reasons for Rejection for Japanese Patent Application No. 2011-074325 (counterpart Japanese patent application), mailed Jul. 10, 2012.

Japan Patent Office, Notice of Reasons for Rejection for Japanese Patent Application No. 2011-074326 (counterpart Japanese patent application), mailed Jul. 10, 2012.

Japan Patent Office, Notice of Reasons for Rejection for Japanese Patent Application No. 2011-074327 (counterpart Japanese patent application), mailed Jul. 10, 2012.

Japan Patent Office, Notice of Reasons for Rejection for Japanese Patent Application No. 2011-074324 (counterpart Japanese patent application), mailed Nov. 6, 2012.

Patent Office, Notice of Reasons for Rejection for Japanese Patent Application No. 2011-074325 (counterpart Japanese patent application), mailed Nov. 6, 2012.

Japan Patent Office, Notice of Reasons for Rejection for Japanese Patent Application No. 2011-074326 (counterpart Japanese patent application), mailed Nov. 6, 2012.

Japan Patent Office, Notice of Decision of Refusal for Japanese Patent Application No. 2011-074327 (counterpart Japanese patent application), mailed Nov. 6, 2012.

Japan Patent Office, Notice of Reasons for Rejection for Japanese Patent Application No. 2011-074324 (counterpart Japanese patent application), mailed Feb. 5, 2013.

Japan Patent Office, Notice of Reasons for Rejection for Japanese Patent Application No. 2011-074325 (counterpart Japanese patent application), mailed Feb. 5, 2013.

Japan Patent Office, Notice of Reasons for Rejection for Japanese Patent Application No. 2011-074326 (counterpart Japanese patent application), mailed Feb. 5, 2013.

Japan Patent Office, Notice of Reasons for Rejection for Japanese Patent Application No. 2011-074324 . (counterpart Japanese patent application), mailed Feb. 5, 2013.

* cited by examiner

METHOD FOR FORMING A CONDUCTIVE PATTERN AND A WIRED BOARD

BACKGROUND OF THE INVENTION

1. Field of the Invention

The present invention relates to a method for forming various patterns such as conductive patterns on a surface of a base material and a wired board having conductive patterns.

2. Description of the Related Art

The wired member, which includes, for example, boards or substrates on which electronic devices such as IC chips are mounted, and flexible printed circuits (FPC) which are usable to electrically connect devices, has a conductive pattern which is formed on a surface of a base material composed of, for example, a silicon material, a glass material, or a synthetic resin material. It is preferable that such a conductive pattern is formed to have a width and a pitch which are as fine as possible, for example, because it is intended to miniaturize the sizes of the board and the wired member.

The lithography method has been hitherto used as a method for forming the fine conductive pattern as described above. In the case of the lithography method, a conductive film is formed on a board surface, and then a resist is further applied thereto. A pattern is developed on the resist, and then the resist, which is disposed at portions other than the pattern, is removed. The conductive film is removed from the area in which the resist has been removed, for example, by means of the etching to form the conductive pattern. However, in the case of the lithography method, it is necessary to perform a plurality of steps. Therefore, the apparatus or equipment is large-sized, and the production cost is expensive as well.

In view of the above, some methods are known to form conductive patterns conveniently. For example, U.S. Pat. No. 6,973,710 B2 (FIG. 6) and United States Patent Publication No. 2005/0158456 A1 (FIG. 6) (corresponding to FIG. 6 in Japanese Patent Application Laid-open No. 2002-261048) describe a method for forming a conductive pattern, in which a plurality of lengthy holes or grooves corresponding to a desired pattern are formed for a base material, and then a conductive liquid is jetted onto the base material from a nozzle of an ink-jet head into the holes or the grooves to form the conductive pattern.

In the case of the method for forming the pattern described in U.S. Pat. No. 6,973,710 B2 and United States Patent Publication No. 2005/0158456 A1, it is necessary that the width of the lengthy hole or the groove is larger then the diameter of the liquid droplet jetted from the nozzle, because the conductive liquid is directly landed on the lengthy hole or the groove from the nozzle of the ink-jet head. In other words, it is impossible to form any conductive pattern which has a width smaller than the liquid droplet diameter. Therefore, there is a certain limit even when it is intended to decrease the width of the conductive pattern.

SUMMARY OF THE INVENTION

An object of the present invention is to provide a method for producing a pattern, which makes it possible to form the pattern having a fine width easily and to provide a wired board having a fine conductive pattern.

According to a first aspect of the present invention, there is provided a method for forming a pattern on a board, comprising a step of providing a base material for forming the board; a step of forming a first groove and a first liquid-receiving section communicated with the first groove, on one surface of the base material; a liquid-charging step of charging a liquid into the first groove communicated with the first liquid-receiving section by landing liquid droplets on the first liquid-receiving section; and a solidifying step of solidifying the liquid charged into the first groove.

According to the first aspect of the present invention, for example, on condition that the width and the length of the first liquid-receiving section are larger than the width of the first groove, when the liquid droplets are landed on the first liquid-receiving section, then the liquid, which is landed on the first liquid-receiving section, flows into the first groove in accordance with the capillary force, and the liquid is charged into the first groove. In other words, the first groove, which has the narrow width, can be filled with the liquid by merely landing the liquid droplets on the first liquid-receiving section which has the large areal size. Therefore, the pattern having the fine and minute width can be easily formed on the base material, and the production cost can be reduced as well. The shape of the first liquid-receiving section in a plan view is not limited to any specified shape such as a rectangular shape. The first liquid-receiving section may have any arbitrary cross-sectional shape as well. The phrase "first liquid-receiving section has the "width" and the "length" longer than the width of the first groove" means the fact that the dimensions of the first liquid-receiving section, which relate to the mutually orthogonal two directions, are longer than the width of the first groove respectively.

In the method for forming the pattern according to the present invention, the first liquid-receiving section may have such a size that a circle, which has the same diameter as a diameter of the liquid droplet, is completely included in the first liquid-receiving section, and the first groove may have a width which is smaller than the diameter of the liquid droplet. The liquid droplets are easily landed on the first liquid-receiving section, because the first liquid-receiving section has such a size that the circle, which is obtained by projecting the liquid droplet to the base material, is completely included therein. The liquid can be charged into the first groove which has the width narrower than the diameter of the liquid droplet and on which the liquid droplet cannot be landed directly, by merely landing the liquid droplets on the first liquid-receiving section which has the large areal size. In other words, the width of the pattern to be formed is not restricted by the diameter of the liquid droplet. Therefore, it is possible to form the pattern having the finer width.

In the method for forming the pattern according to the present invention, liquid repellence of the one surface of the base material may be higher than liquid repellence of a surface for defining the first groove and the first liquid-receiving section. In this arrangement, the liquid, which is allowed to flow from the first liquid-receiving section into the first groove, can be prevented from any outflow to the surface of the base material.

The method for forming the pattern according to the present invention may further comprise a liquid-repellent film-forming step of forming a liquid-repellent film which has liquid repellence higher than the liquid repellence of the surface for defining the first groove and the first liquid-receiving section, the liquid-repellent film being formed on the one surface of the base material, and the liquid-repellent film-forming step being performed before the step of forming the first groove and the first liquid-receiving section or the recess-forming step. When the liquid-repellent film is formed on the one surface of the base material as described above, the liquid, which is allowed to flow from the first liquid-receiving section into the plurality of first grooves, can be reliably prevented from any outflow to the surface of the base material.

In the method for forming the pattern according to the present invention, the liquid-repellent film may be formed of a fluorine-based resin. In this arrangement, it is possible to avoid the outflow of the liquid to the surface of the base material reliably.

In the method for forming the pattern according to the present invention, the liquid may be composed of a conductive material. In this arrangement, the conductive pattern, which has a narrow width, can be formed with ease by landing the liquid composed of the conductive material on the first liquid-receiving section. The conductive material, which is charged into the first liquid-receiving section, can be utilized as a connecting terminal for connecting, for example, an electronic part (electronic device) such as IC and a wired member.

The method for forming the pattern according to the present invention may further comprise an electronic part-installing step of installing an electronic part on the one surface of the base material, the electronic part-installing step being performed between the step of forming the first groove and the first liquid-receiving section and the liquid-charging step; wherein the electronic part may be installed in the electronic part-installing step so that a terminal of the electronic part is overlapped with the first groove. According to this procedure, the electronic part is installed to the one surface of the base material so that the terminal thereof is overlapped with the first groove, and then the liquid droplets are landed on the first liquid-receiving section. Accordingly, the liquid is charged into the first groove, simultaneously with which the terminal of the electronic part and the conductive pattern can be connected to one another at a portion of the first groove. Therefore, it is unnecessary to press the electronic part against the base material in order to connect the electronic part and the conductive pattern to one another. Neither the electronic part nor the base material is damaged.

The method for forming the pattern according to the present invention may further comprise a bump-forming step of forming a protruding bump by further landing conductive liquid droplets on a surface of the conductive material solidified on the first liquid-receiving section after the solidifying step. The protruding bump, which is used to connect the electronic part such as IC to be installed on the base material, can be further formed on the conductive material as the connecting terminal charged into the first liquid-receiving section as described above. Therefore, the conductive pattern and the electronic part can be reliably connected to one another by the aid of the bump.

In the method for forming the pattern according to the present invention, the liquid may be landed on the first liquid-receiving section until a liquid surface of the liquid rises to be higher than the one surface of the base material in the liquid-charging step. The protruding bump can be formed on the first liquid-receiving section or the first recess such that the liquid droplets are landed on the first liquid-receiving section until arrival at the state in which the liquid surface of the liquid rises to be higher than the one surface of the base material, and then the liquid is solidified in the solidifying step as described above. In other words, it is unnecessary to perform any special step in order to form the bump after forming the conductive pattern. Therefore, the production steps can be simplified, while the conductive pattern and the electronic part are reliably connected to one another by the aid of the protruding bump.

In the method for forming the pattern according to the present invention, the first liquid-receiving section may include two landing sections, and the two landing sections may be formed at both ends of the first groove respectively in the step of forming the first groove and the first liquid-receiving section; and the liquid droplets may be landed on the two landing sections respectively in the liquid-charging step. In this procedure, the liquid flows into the first groove from the two landing sections disposed at the both ends. Therefore, it is possible to charge the liquid into the first groove quickly.

In the method for forming the pattern according to the present invention, a second groove may be formed on the other surface of the base material, and a communication hole, which penetrates through the base material and which makes mutual communication between the first groove formed on the one surface and the second groove formed on the other surface, may be formed in the step of forming the first groove and the first liquid-receiving section; and the liquid may be charged into the first groove, and the liquid may be also charged into the second groove via the communication hole in the liquid-charging step.

According to this arrangement, the pattern which includes the liquid charged into the first groove and the pattern which includes the liquid charged into the second groove are formed on the both surfaces of the base material respectively. Further, the patterns, which are formed on the both surfaces, can be connected to one another by charging the liquid into the communication hole which penetrates through the base material. Further, any pattern, which has a complicated shape such that the two patterns formed on the both surfaces respectively are connected to one another via the communication hole that penetrates through the base material, can be formed with ease.

In the method for forming the pattern according to the present invention, a second liquid-receiving section, which makes communication with the second groove, may be formed on the other surface of the base material in the step of forming the first groove and the first liquid-receiving section. According to this arrangement, the liquid droplets can be landed on the first liquid-receiving section on the one surface of the base material to charge the liquid into the first groove. Further, the liquid droplets can be landed on the second liquid-receiving section on the other surface of the base material to charge the liquid into the second groove. Therefore, the liquid can be charged into the first groove and the second groove quickly. When the liquid is composed of the conductive material, the electronic parts such as IC's can be installed to the first liquid-receiving section on the one surface of the base material and the second liquid-receiving section on the other surface of the base material respectively. The plurality of electronic parts can be arranged at a high density on the base material. In the present invention, the second liquid-receiving section is not limited to any specified shape in a plan view such as a rectangular shape in the same manner as the first liquid-receiving section, which may have any arbitrary shape. The cross-sectional shape of the second liquid-receiving section may be any arbitrary shape as well in the same manner as the first liquid-receiving section. The phrase "second liquid-receiving section has the "width" and the "length" longer than the width of the second groove" means the fact that the dimensions of the second liquid-receiving section, which relate to the mutually orthogonal two directions, are longer than the width of the second groove respectively.

The method for forming the pattern according to the present invention may further comprise a resist layer-forming step of forming a resist layer on the one surface of the base material, the resist layer-forming step being performed before the step of forming the first groove and the first liquid-receiving section; wherein a through-hole, which arrives at the one surface of the base material, may be formed through the resist layer, and thus the first groove and the first liquid-receiving section may be formed in the step of forming the first groove and the first liquid-receiving section; and the method may further comprise a resist layer-removing step of removing the resist layer after solidifying the liquid in the solidifying step after charging the liquid into the first groove in the liquid-charging step. According to this procedure, the liquid is charged and solidified in the first groove and the first liquid-receiving section formed on the one surface of the base material and in the through-hole of the resist layer, and then the resist layer is removed. Accordingly, it is possible to form a pattern having such a shape that the pattern protrudes from the surface of the base material by an amount of the thickness of the resist layer.

In the method for forming the pattern according to the present invention, the first groove and the first liquid-receiving section may be formed by means of laser processing in the step of forming the first groove and the first liquid-receiving section. In this procedure, the first groove and the first liquid-receiving section can be formed highly accurately. Further, it is easy to form the first groove and the second groove so that they have a variety of shapes. This procedure is especially suitable for producing various types of products in small amounts. The portion of the surface of the base material, which is irradiated with the laser, is in a rough state. Therefore, the liquid repellence of the portion is lowered. Accordingly, when the first groove and the first liquid-receiving section are formed by radiating the laser, it is possible to form the first groove and the first liquid-receiving section each of which has such a surface that the liquid repellence is low as compared with the surface of the base material at other portions not irradiated with the laser.

In the method for forming the pattern according to the present invention, the first groove may include a plurality of grooves, and the first liquid-receiving section may include a plurality of liquid-receiving sections. In this arrangement, it is possible to easily form a pattern having a complicated shape. The present invention includes not only the form in which one of a plurality of grooves is communicated to one of a plurality of liquid-receiving sections but also the form in which two or more grooves are commonly communicated with one of a plurality of liquid-receiving sections.

In the method for forming the pattern according to the present invention, the first groove may have a width of not more than 20 µm. In general, when the width of the groove is not more than 2 to 3 mm, the liquid, which is charged into the groove, is spread while causing the wetting in the groove in accordance with the capillary force. When the width of the groove is not more than 20 µm as in the present invention, then the capillary force effectively acts, and the liquid is quickly spread while causing the wetting along with the groove. On the other hand, the spherical liquid droplet, which has a diameter of about 20 µm, has a volume of about 4 pl. Therefore, in order to directly land the liquid droplet on the groove having a width of not more than 20 µm, it is necessary that the volume of the liquid droplet is not more than about 4 pl, which is extremely difficult. On the contrary, in the present invention, the liquid droplets are landed on the liquid-receiving section which has a relatively large areal size, and thus the liquid can be easily charged into the groove having the extremely narrow width which is not more than 20 µm.

In the method for forming the pattern according to the present invention, the liquid may be a conductive nanoparticle ink containing nanoparticles of silver or gold. In this arrangement, it is possible to easily form the pattern of the conductive wiring on the board.

In the method for forming the pattern according to the present invention, the liquid may be an adhesive. In this case, for example, the electronic part or the like can be easily fixed onto the board by utilizing the adhesive which is allowed to flow along the pattern formed on the board.

In the method for forming the pattern according to the present invention, a width and a length of the first liquid-receiving section may be longer than a width of the first groove. Further, a width and a length of the second liquid-receiving section may be longer than a width of the second groove. In any case, the liquid can be easily charged into the groove having the narrow width by landing the liquid droplets on the relatively wide liquid-receiving section.

In the method for forming the pattern according to the present invention, the liquid may be landed until the electronic part makes contact with a surface of the liquid in the liquid-charging step. In this procedure, it is unnecessary to form the bump by landing the liquid again after solidifying the liquid. The liquid droplets are landed until the liquid surface rises in the liquid-charging step, and thus it is possible to allow the electronic part to make contact with the liquid surface. After that, the liquid is solidified, and thus the electronic part can be mounted on the board by means of a small number of the steps.

According to a second aspect of the present invention, there is provided a wired board provided with a wiring pattern; the wired board comprising a base material; a groove which is formed on one surface of the base material; a recess which is formed on the one surface of the base material and which is communicated with the groove; and a wiring material or a wiring member which is charged into the groove and the recess.

According to the second aspect of the present invention, the wiring material is charged into the inside of the groove or the recess. Therefore, the wired board has the high reliability, for example, with respect to the disconnection or breaking of the wire as compared with a case in which the wiring is provided while being exposed on a flat surface. Further, for example, the recess can be utilized as a terminal, because the wiring material is also charged into the recess communicated with the groove, wherein the degree of freedom of use is enhanced.

In the wired board according to the present invention, the wiring material may be composed of a conductive material. In this arrangement, the wired board can be utilized for the electric wiring.

In the wired board according to the present invention, a surface of the wiring material charged into the groove and the recess may rise as compared with the one surface of the base material. A greater part of the wiring material charged into the recess and the groove exists at the inside of the recess and the groove. Therefore, the high reliability is obtained with respect to the disconnection of the wire or the like. On the other hand, a part of the wiring material protrudes from the one surface of the base material. Therefore, for example, when the electronic part or the like is mounted, it is possible to omit the step of forming the bump.

In the wired board according to the present invention, a surface of the wiring material charged into the groove and the recess may be recessed as compared with the one surface of the base material. In this arrangement, the wiring material is protected by the groove and the recess. Therefore, there is no fear of the disconnection of the wire or the like. The reliability is further enhanced.

In the wired board according to the present invention, the conductive material may include nanoparticles of silver or gold. In this arrangement, the wiring, which is formed on the wired board, is excellent in the electric conductivity. Therefore, it is possible to suppress the loss of the electric power such as the generation of heat.

In the wired board according to the present invention, the groove may include a plurality of individual grooves, and the recess may include a plurality of individual recesses. In this arrangement, it is possible to increase the mounting density of the wiring formed on the wired board. In this arrangement, it is not necessarily indispensable that the plurality of individual grooves and the plurality of individual recesses correspond to one another one by one. The present invention also includes, for example, such an embodiment that one of the individual recesses is communicated with two or more of the individual grooves.

In the present invention, the formation of the pattern also includes a step of mounting an electronic device such as IC and connecting the electronic device to the wiring.

BRIEF DESCRIPTION OF THE DRAWINGS

FIG. 3A to 3G show steps of producing the board according to the first embodiment, wherein FIG. 3A shows a liquid-repellent film-forming step, FIG. 3B shows a recess-forming step, FIG. 3C shows an initial state of a liquid-charging step in which liquid droplets are landed on a recess, FIG. 3D shows an intermediate state of the liquid-charging step in which a liquid flows into a groove, FIG. 3E shows a solidifying step, FIG. 3F shows a bump-forming step, and FIG. 3G shows a driver IC-installing step.

FIG. 7A to 7B show parts of a method for producing a board according to a fourth modified embodiment, wherein FIG. 7A shows an initial state of a liquid-charging step in which liquid droplets are landed on a recess, and FIG. 7B shows an intermediate state of the liquid-charging step in which a liquid flows into a groove.

FIG. 8A to 8C show parts of a method for producing a board according to a fifth modified embodiment, wherein FIG. 8A shows an initial state of a liquid-charging step in which liquid droplets are landed on a recess, FIG. 8B shows a state in which the liquid-charging step is completed, and FIG. 8C shows a solidifying step.

FIG. 9A to 9D show parts of a method for producing a board according to a sixth embodiment, wherein FIG. 9A shows a recess-forming step, FIG. 9B shows a driver IC-installing step, FIG. 9C shows an intermediate state of a liquid-charging step, and FIG. 9D shows a state in which the liquid-charging step is completed.

FIG. 14A to 14E show a method for producing the board according to the eighth modified embodiment, wherein FIG. 14A shows a liquid-repellent film-forming step, FIG. 14B shows a recess-forming step, FIG. 14C shows a liquid-charging step, FIG. 14D shows a solidifying step, and FIG. 14E shows a driver IC-installing step.

FIG. 20A to 20H show a method for producing the board according to the second embodiment, wherein FIG. 20A shows a resist layer-forming step, FIG. 20B shows a state in which the board is pressed against molds in a recess-forming step, FIG. 20C shows a state of completion of the recess-forming step in which grooves and recesses are formed, FIG. 20D shows a liquid-charging step, FIG. 20E shows a solidifying step, FIG. 20F shows a bump-forming step, FIG. 20G shows a resist layer-removing step, and FIG. 20H shows a driver IC-installing step.

DESCRIPTION OF THE PREFERRED EMBODIMENTS

First Embodiment

Figure 1:
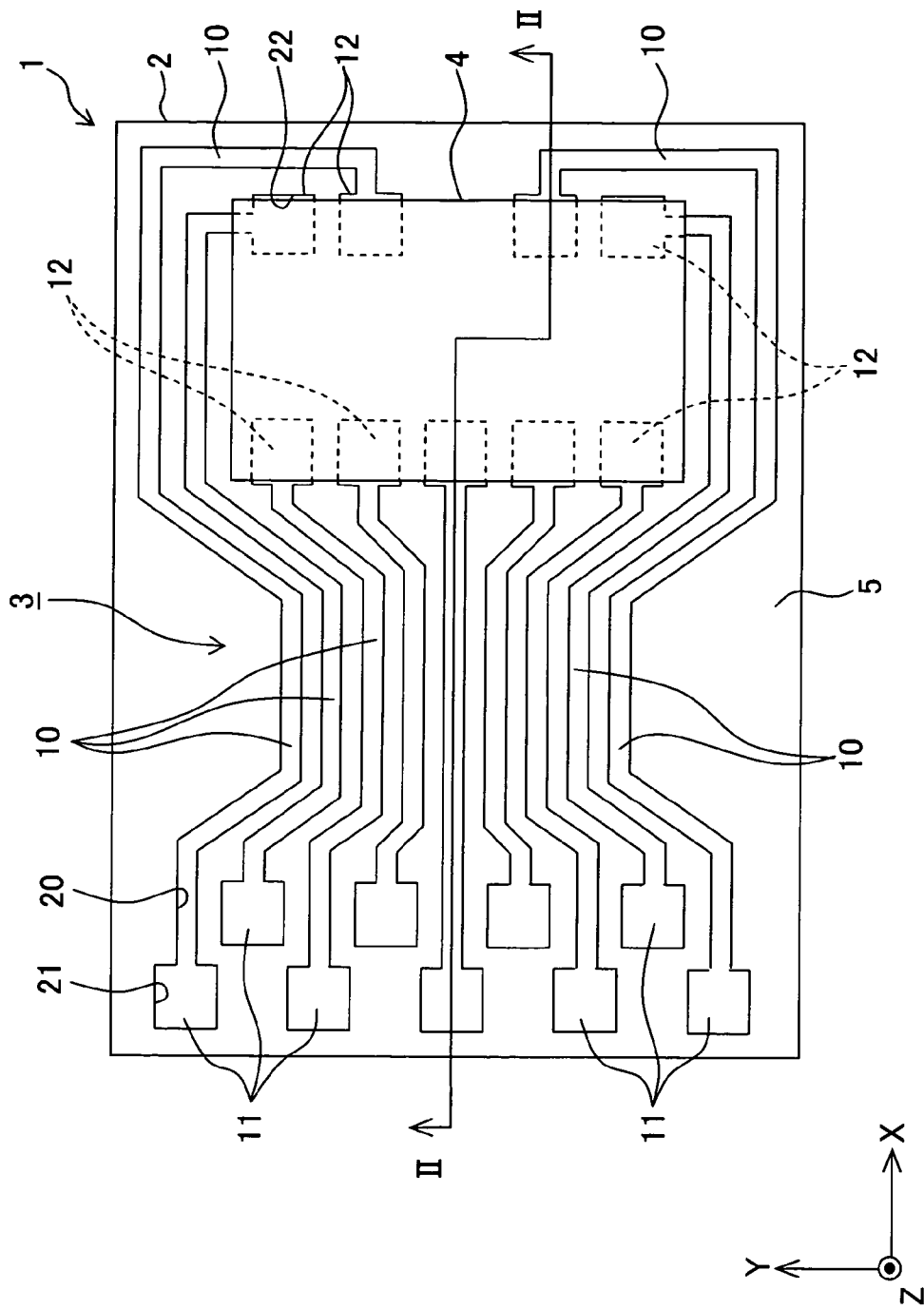
FIG. 1 shows a plan view illustrating a board according to a first embodiment of the present invention.

A first embodiment of the present invention will be explained. The first embodiment is an example of the application of the present invention to a case in which a conductive pattern is formed on a surface of a flat plate-shaped base material for constructing a board. The following description will be made assuming that the X axis direction shown in FIG. 1 is defined as the longitudinal direction or the left and right directions, and the direction (upward direction in FIG. 2), which is directed to the front side of the paper surface of FIG. 1 in the Z axis direction, is defined as the upward direction.

Figure 2:
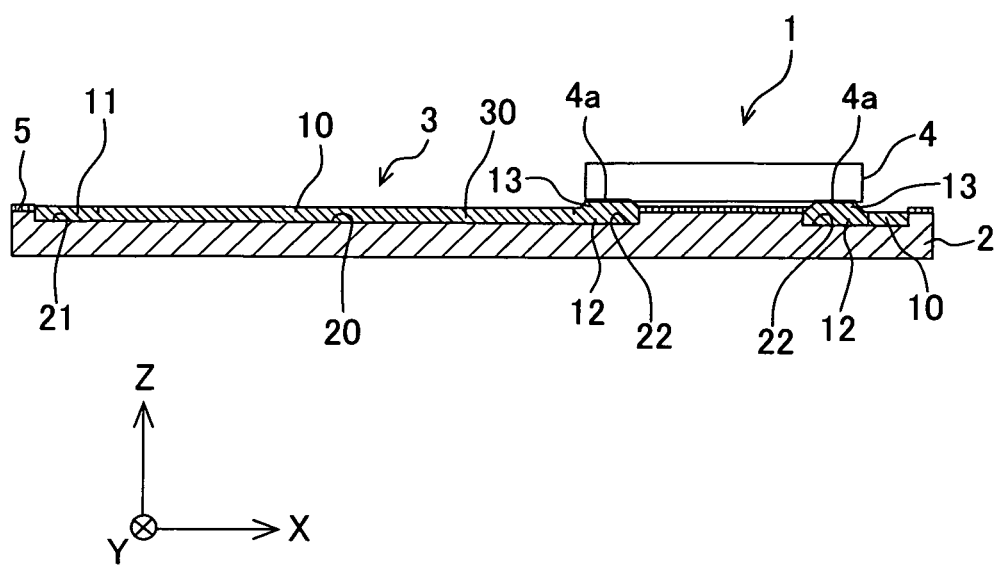
FIG. 2 shows a sectional view taken along a line II-II shown in FIG. 1.

At first, the board 1 will be explained. As shown in FIGS. 1 and 2, the board 1 has the flat plate-shaped base material 2 which is composed of an insulating material, and the conductive pattern 3 which is formed on an upper surface of the base material 2. A driver IC 4 (electronic part), which serves as a driving circuit electrically connected to the conductive pattern 3, is also installed on the upper surface of the base material 2. The board 1 is electrically connected to various units (not shown) such as actuators as driving objectives of the driver IC 4.

The base material 2 is composed of an insulating material including, for example, a synthetic resin material such as polyimide resin, a ceramic material such as alumina and zirconia, and a glass material. A liquid-repellent film 5, which is composed of a fluorine-based resin and which enhances the liquid repellence of the upper surface of the base material 2, is formed on the upper surface of the base material 2. The function of the liquid-repellent film 5 will be described in detail in the explanation of the production steps described later on.

A plurality of grooves 20 and a plurality of recesses 21, 22 are formed on the upper surface of the base material 2. The recesses 21, 22 are provided at the both ends of each of the grooves 20 respectively. The recesses 21, 22 are communicated with the groove 20. The conductive pattern 3 is formed by a conductive material 30 which is charged into the grooves 20 and the recesses 21, 22. The conductive pattern 3 includes a plurality of wiring sections 10 and connecting terminals 11, 12 which are provided at the both ends of the wiring sections 10. The wiring sections 10 are formed by the grooves 20 and the conductive material 30 charged into the grooves 20. The connecting terminals 11, 12 are formed by the recesses 21, 22 which are formed at the both ends of the grooves 20 and the conductive material 30 which is charged into the recesses 21, 22. The width of each of the wiring sections 10 is fairly narrow (for example, about 20 µm). The pitch (spacing distance) between the plurality of wiring sections 10 is extremely narrow as well (for example, about 20 µm). On the other hand, the connecting terminals 11, 12 have rectangular shapes in a plan view, which are provided at both of the left and right ends of the base material. The width and the length of each of the connecting terminals 11, 12 are sufficiently larger than the width of the wiring section 10 (for example, about 70 µm).

As shown in FIG. 1, the plurality of connecting terminals 12, which are positioned at the right ends of the plurality of wiring sections 10, are arranged and clustered in an area disposed on the right side of the upper surface of the board 1. As shown in FIG. 2, conductive bumps 13, which protrude upwardly, are provided for the plurality of connecting terminals 12 respectively. Further, the driver IC 4 is installed so that the driver IC 4 is overlapped with the plurality of connecting terminals 12. A plurality of terminals 4a, which are provided on the lower surface of the driver IC 4, are electrically connected to the plurality of connecting terminals 12 via the bumps 13 respectively. On the other hand, the plurality of connecting terminals 11, which are provided at the left ends of the plurality of wiring sections 10 respectively, are connected to various units (not shown) such as actuators as the driving objectives of the driver IC 4 respectively.

Next, an explanation will be made principally with reference to FIG. 3 about a method for producing the board 1 described above. A method for forming the conductive pattern 3 on the upper surface of the base material 2 will now be explained specifically in detail below.

Figure 3A:
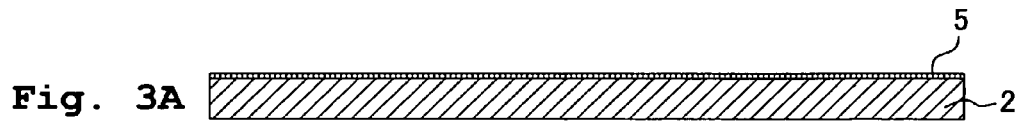

At first, as shown in FIG. 3A, the liquid-repellent film 5, which is composed of the fluorine-based resin, is formed on the entire upper surface of the base material 2 which is composed of an insulating material including, for example, a flexible synthetic resin material such as polyimide resin, aramid resin, phenol resin, and liquid crystal polymer, and a ceramic material having high rigidity such as alumina and zirconia (liquid-repellent film-forming step). The liquid-repellent film 5 can be formed, for example, by means of a method such as the spin coat. The liquid repellence of the upper surface of the base material 2 is remarkably enhanced in the state in which the liquid-repellent film 5 is formed on the base material 2 as described above, as compared with the state in which the liquid-repellent film 5 is absent.

Figure 3B:
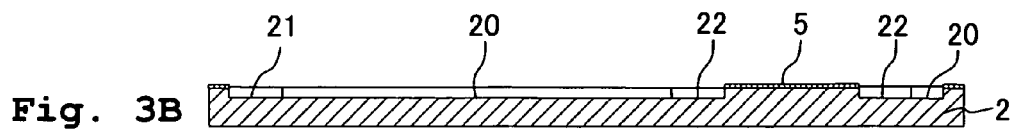

Subsequently, as shown in FIG. 3B, the plurality of grooves 20 (first grooves) and the plurality of recesses 21, 22 (first recesses) having the rectangular shapes in a plan view, which correspond to the plurality of wiring sections 10 and the plurality of connecting terminals 11, 12 of the conductive pattern 3 shown in FIG. 1 respectively, are formed on the upper surface of the base material 2 on which the liquid-repellent film 5 has been formed (recess-forming step). That is, as shown in FIG. 1, the plurality of grooves 20 are formed at a predetermined pitch (for example, 20 µm). Further, the two recesses 21, 22, which are communicated with the groove 20, are formed at the both ends of each of the grooves 20.

Figure 4:
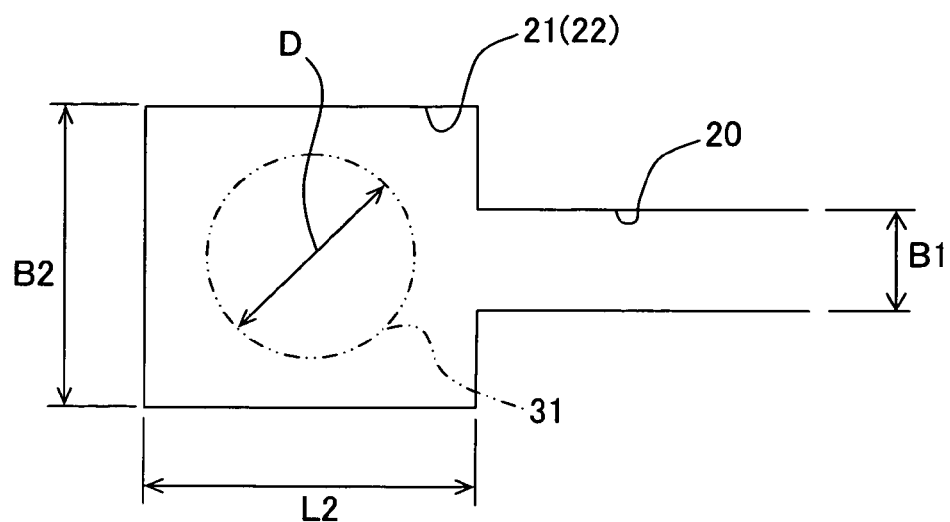
FIG. 4 shows a magnified plan view illustrating those disposed in the vicinity of the recess of a base material.

In this arrangement, as shown in FIG. 4, the recesses 21, 22 are formed so that the width B2 and the length L2 of each of the recesses 21, 22 are larger than the width B1 of the groove 20 communicated therewith (for example, B2=L2=70 µm for B1=20 µm). It is preferable that the plurality of grooves 20 and the plurality of recesses 21, 22 are formed by means of the laser processing based on the use of, for example, the excimer laser, the YAG laser, or the femtosecond laser, for the following reason. That is, the wettability of the surface for defining the grooves 20 and the recesses 21, 22 to be formed is enhanced, because the surface, which is irradiated with the laser, becomes the rough surface. When the processing is performed by using the laser, it is possible to form the plurality of grooves 20 and the plurality of recesses 21, 22 highly accurately. It is easy to form the plurality of grooves 20 and the plurality of recesses 21, 22 so that they have various shapes. Therefore, the laser processing is especially suitable for the production of various types of products in small amounts. As described above, the liquid-repellent film 5 is formed on the upper surface of the base material 2. Therefore, the liquid repellence of the upper surface of the base material 2 is enhanced to be higher than the liquid repellence of the inner surfaces of the grooves 20 and the recesses 21, 22.

Figure 3C:
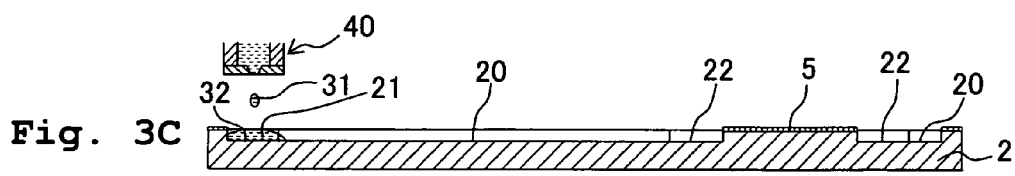
Figure 3D:
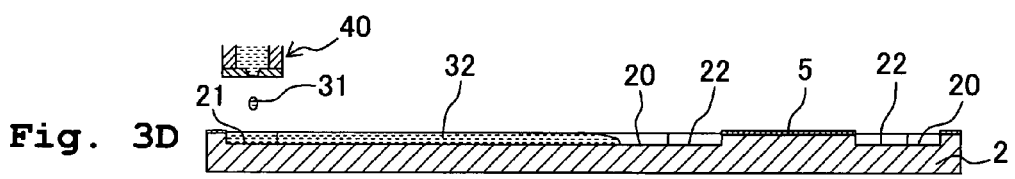

Subsequently, as shown in FIGS. 3C and 3D, conductive liquid droplets 31 are jetted from a liquid droplet-jetting unit 40 such as an ink-jet head or a microdispenser so that the liquid droplets 31 are landed on one of the two recesses 21, 22 communicated with each of the grooves 20 to charge the conductive liquid 32 into the groove 20 (liquid-charging step). In FIG. 3C, the liquid droplets 31 are landed on the recess 21. Various types of materials can be used as the conductive liquid 32. This embodiment will be explained as exemplified by a case of the use of a conductive nanoparticle ink in which metal nanoparticles (for example, the diameter is about 7 nm) composed of, for example, silver or gold exist in a solvent in a state of being independently dispersed without being coagulated.

As shown in FIG. 3C, when the liquid droplets 31 are landed on the recess 31 which is positioned at the left end of the groove 20, the liquid 32 is attracted into the groove 20 owing to the action of the capillary force, because the width B1 of the groove 20 is sufficiently narrow. The inner surface 20a of the groove 20 is easily wettable (the wetting angle is smaller than 90°), i.e., the adhesive force between the liquid 32 and the inner surface 20a is larger than the intermolecular cohesive force of the liquid 32. Therefore, the liquid 32 is spread while causing wetting along with the groove 20 (capillary phenomenon). Therefore, as shown in FIG. 3D, the liquid 32, which has flown into the groove 20, flows until arrival at the other recess 22 (disposed at the right end as shown in FIG. 3). Accordingly, the liquid 32 is charged into each of the grooves 20 and the two recesses 21, 22 communicated with the groove 20. In FIGS. 3C and 3D, the liquid droplets 31 are landed on the recess 21 disposed at the left end, of the two recesses 21, 22 provided at the both ends of each of the grooves 20. However, the liquid droplets 31 may be landed on the recess 22 disposed at the right end.

In this embodiment, as described above, the liquid-repellent film 5 is formed on the upper surface of the base material 2. The liquid repellence of the upper surface is higher than the liquid repellence of the inner surfaces of the groove 20 and the recesses 21, 22. Accordingly, the liquid 32, which flows into the groove 20 from the recess 21, hardly outflows. The liquid 32 is reliably prevented from the outflow to the upper surface of the base material 2.

It is preferable that the groove 20 and the recesses 21, 22 are formed in the recess-forming step so that the width B2 and the length L2 of the recess 21, 22 (for example, B2=L2=70 µm) are larger than the diameter D of the in-flight liquid droplet 31 before being landed (for example, 40 µm), and the width B1 of the groove 20 (for example, 20 µm) is smaller than the diameter D of the liquid droplet 31 as shown in FIG. 4. Accordingly, the recess 21, 22 can be constructed so that the circle, which is obtained by projecting the liquid droplet 31 to the base material 2 before being landed (circle having the diameter of D), is completely included. When the width and the length of the recess 21, 22 are made larger than the diameter of the liquid droplet 31 as described above, the liquid droplet 31 can be easily landed on the recess 21, 22. The liquid 32 can be also charged into the groove 20 which has the width narrower than the diameter of the liquid droplet 31 and on which the liquid droplet 31 cannot be landed directly, by merely landing the liquid droplet 31 on the recess 21, 22 having the wide areal size.

Figure 3E:
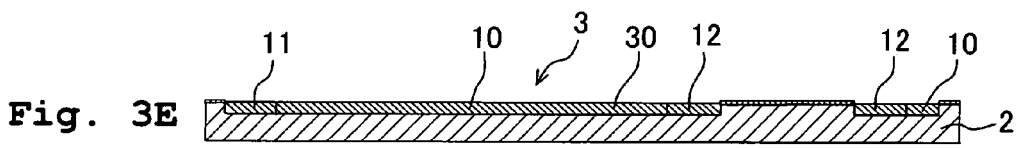

Subsequently, as shown in FIG. 3E, the base material 2 is heated to a predetermined temperature (for example, about 200° C. when the base material 2 is composed of polyimide resin) which is not more than the heat resistance temperature of the base material 2 so that the liquid 32 (conductive nanoparticle ink), which has been charged into the plurality of grooves 20 and the plurality of recesses 21, 22, is sintered and solidified (solidifying step). The conductive pattern 3, which is composed of the plurality of wiring sections 10 and the plurality of connecting terminals 11, 12, is constructed on the base material 2 by the conductive material 30 formed by solidifying the conductive liquid 32 changed into the plurality of grooves 20 and the plurality of recesses 21, 22 as described above.

Figure 3F:
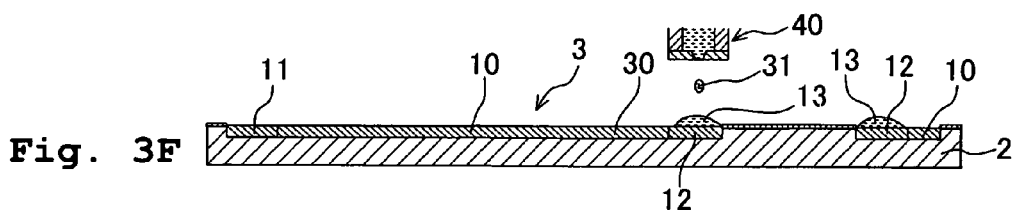
Figure 3G:
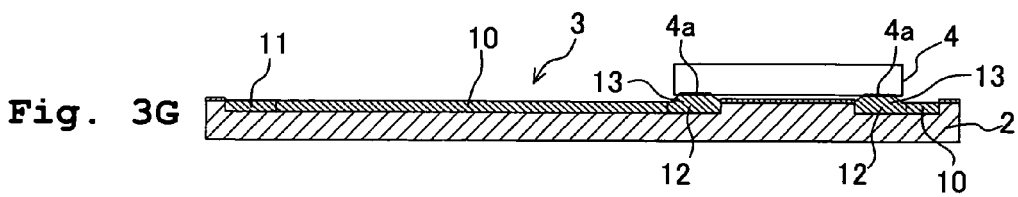

After that, as shown in FIG. 3F, the conductive liquid droplets 31, which are in a small amount and which are composed of the same conductive nanoparticle ink as that of the liquid 32 charged into the grooves 20 and the recesses 21, 22, are landed by the liquid droplet-jetting unit 40 such as the ink-jet head on the surface of the conductive material 30 solidified in the recesses 22 positioned at the right ends of the respective grooves 20 to form the protruding bumps 13 (bump-forming step). Further, as shown in FIG. 3G, the driver IC 4 is positioned so that the plurality of terminals 4a, which are formed on the lower surface of the driver IC 4, are overlapped with the plurality of bumps 13 as viewed in a plan view, in a state in which the bumps 13 are not solidified, and then the driver IC 4 is installed while pressing the driver IC 4 against the upper surface of the base material 2. Further, the base material 2 is heated to approximately a predetermined temperature (for example, 200° C.) to solidify the bumps 13 so that the bumps 13 are connected to the terminals 4a of the driver IC 4. Therefore, the connecting terminals 12 of the conductive pattern 13 are reliably connected to the terminals 4a of the driver IC 4 by the aid of the bumps 13.

The foregoing explanation is illustrative of the exemplary case in which the conductive nanoparticle ink is used as the conductive liquid 32. However, it is also possible to use any other conductive liquid such as melted solder. For example, when the solder is used, the melted solder is charged into the grooves 20 and the recesses 21, 22 in a state in which the base material 2 is heated to a temperature which is not less than the melting point of the solder (for example, 100° C. to 180° C.) in the liquid-charging step (FIGS. 3C and 3D). The temperature of the base material 2 is lowered to a temperature which is lower than the melting point of the solder in the solidifying step (FIG. 3E). Accordingly, it is possible to solidify the solder charged into the grooves 20 and the recesses 21, 22.

According to the method for producing the board 1 (method for forming the conductive pattern) explained above, the following effect is obtained. The width and the length of the recesses 21, 22 communicated with each of the grooves 20 can be made larger than the width of the groove 20. Therefore, the liquid 32 can be charged into the groove 20 having the narrow width as well by landing the conductive liquid droplets 31 on the recess 21, 22 having the large areal size. In general, when the width of the groove having the easily wettable inner wall is not more than 2 to 3 mm, the liquid is spread by the capillary force while causing the wetting along the groove. However, it is desirable that the width of the groove 20 is not more than about 20 µm as in this embodiment. In such a situation, the capillary force, which has the sufficient strengh, acts. Therefore, the liquid 32 can be thoroughly delivered to the entire grooves 20 quickly. Even in the case of the groove having the fine width as described above, the liquid is spread while causing the wetting along the groove in accordance with the capillary force. Therefore, the conductive pattern 3 (wiring sections 10) having the fine width can be easily formed on the base material 2. The production cost can be also reduced.

When the recesses 21, 22 are formed so that the width and the length thereof are larger than the diameter of the liquid droplet 31 to be landed, it is easy to land the liquid droplet 31 on the recesses 21, 22. Further, when the grooves 20 are formed so that the width of the groove 20 is smaller than the diameter of the liquid droplet 31, the liquid 32 can be easily charged into the grooves 20 on which the liquid droplet 31 cannot be landed directly due to the narrow width. In other words, the width of the wiring section 10 is not restricted by the diameter of the liquid droplet 31 jetted by the liquid droplet-jetting unit 40. Therefore, it is possible to form the wiring section 10 having the finer width.

Various other electronic parts (electronic devices) can be connected to the connecting terminals 12, other than the IC chip such as the driver IC 4. The electronic parts can be also connected to the two connecting terminals 11, 12 provided at the both ends of the respective wiring sections 10 respectively. Further, for example, a conductive pattern formed on a wired member or the like or any other unit can be also connected to the connecting terminals 11, 12.

The plurality of grooves are formed on the board of this embodiment, and the recesses are formed at the both ends of each of the grooves respectively. However, the number and the arrangement of the groove or grooves and the recess or recesses to be formed may be arbitrary. For example, the recess may be formed at only one end of each of the grooves. Only one groove, which has the recess or recesses at one end or both ends, may be formed. Alternatively, one recess may be communicated with a plurality of grooves, and/or one groove may be branched into two or more grooves. In this embodiment, the width of the recess is formed to be larger than the width of the groove. However, the width of the recess can be formed to be narrower than the width of the groove. Further, the width of the recess can be formed to be the same as the width of the groove. In particular, when the width of the groove is the same as the width of the recess, one end of the groove corresponds to the recess.

Next, modified embodiments, in which various modifications are applied to the first embodiment described above, will be explained. However, the components or parts, which are constructed in the same manner as in the first embodiment, are designated by the same reference numerals, any explanation of which will be appropriately omitted.

First Modified Embodiment

Figure 5:
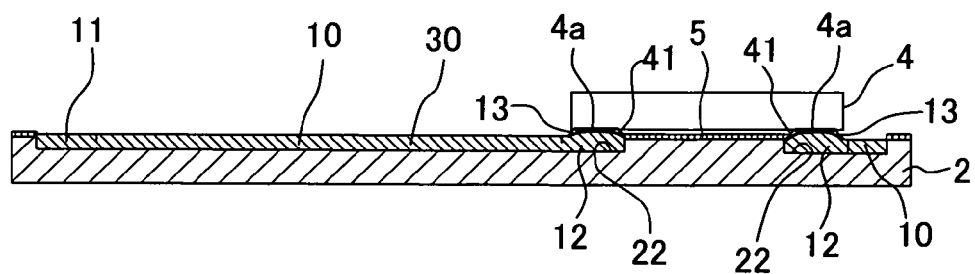
FIG. 5 shows a sectional view illustrating a first modified embodiment corresponding to FIG. 2.

As shown in FIG. 5, surface layers 41 may be formed on the bumps 13 such that the bumps 13, which are composed of, for example, silver or gold, are formed on the surface of the conductive material 30 (connecting terminals 12) charged into the recesses 22, and then conductive liquid droplets, which contain a metal material such as melted solder different from the material of the bumps 13, are landed on the surfaces of the bumps 13.

Second Modified Embodiment

It is not necessarily indispensable that the liquid-repellent film 5 is formed on the upper surface of the base material 2. It is also allowable that the liquid-repellent film-forming step is omitted. Also in this case, on condition that the surface roughness of the inner surface of the groove 20 and the recesses 21, 22 is larger than the surface roughness of the upper surface of the base material 2, the liquid repellence of the inner surface of the groove 20 and the recesses 21, 22 is lower than the liquid repellence of the upper surface of the base material 2. For example, when the groove 20 and the recesses 21, 22 are formed by means of the laser processing, then the inner surface for defining the groove 20 and the recesses 21, 22 can be made rough, and the wettability can be enhanced. In this case, the liquid repellence of the upper surface of the base material 2 is relatively higher than the liquid repellence of the inner surface of the groove 20 and the recesses 21, 22. Therefore, when the liquid droplets are landed on the recesses 21, 22 to charge the liquid 32 into the groove 20, the liquid 32 hardly flows to the upper surface of the base material 2.

Third Modified Embodiment

Figure 6:
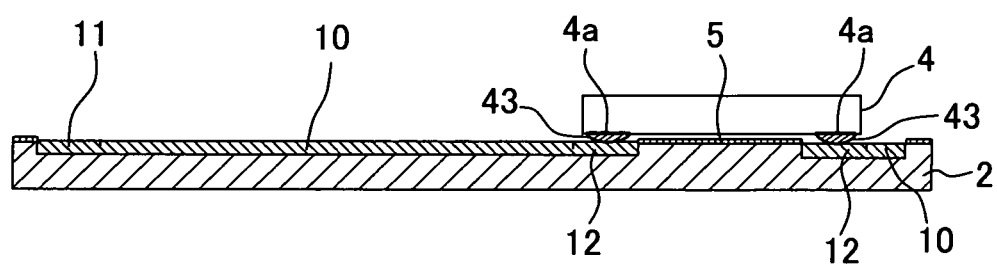
FIG. 6 shows a sectional view illustrating a third modified embodiment corresponding to FIG. 2.

In the first embodiment described above, the bumps 13 are formed on the base material 2. However, as shown in FIG. 6, bumps 43, which protrude downwardly, may be previously formed on the surfaces (lower surfaces) of the terminals 4a of the driver IC 4. In this arrangement, it is possible to omit the step of forming the bumps 13 on the base material 2.

Fourth Modified Embodiment

Figure 7A:
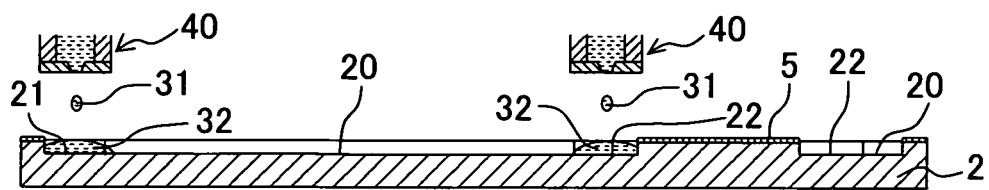
Figure 7B:
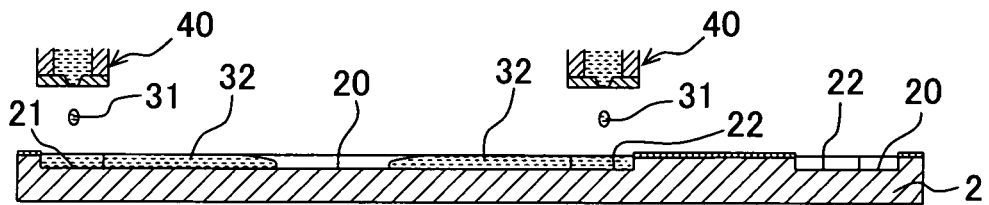

As shown in FIG. 7A, the conductive liquid droplets 31 may be landed on the two recesses 21, 22 provided at the both ends of the respective grooves 20 respectively. In this procedure, as shown in FIG. 7B, the liquid 32 flows into the groove 20 from the two recesses 21, 22 disposed at the both ends thereof respectively. Therefore, the liquid 32 can be charged into the groove 20 quickly.

Fifth Modified Embodiment

Figure 8A:
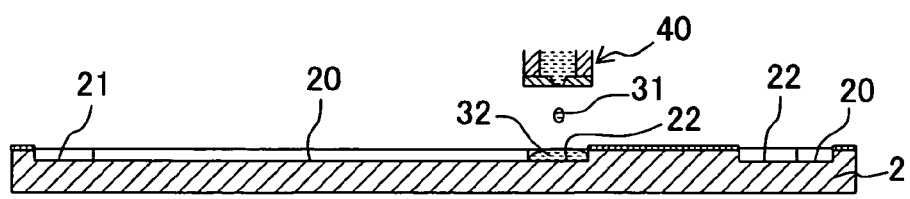
Figure 8B:
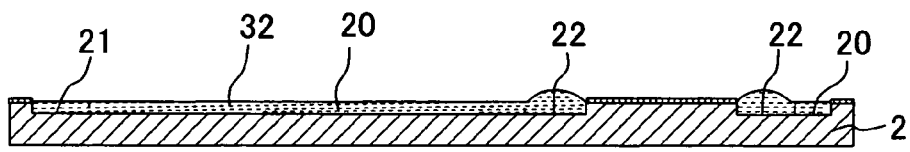
Figure 8C:
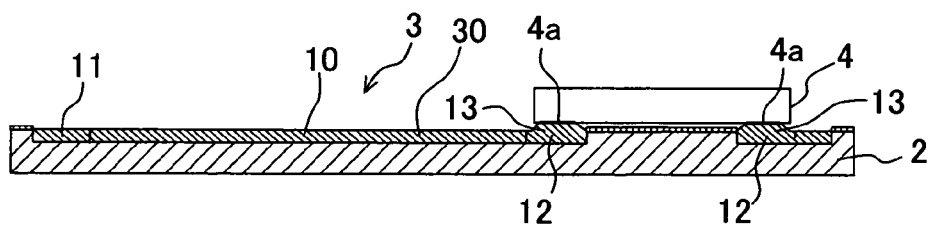

As shown in FIG. 8A, the liquid droplets 31 may be landed on the recess 22 provided at the right end of each of the grooves 20 (on the side of the installation of the driver IC 4) to progressively charge the liquid 32 into the groove 20. Further, as shown in FIG. 8B, the liquid 32 may be charged until the liquid surface of the liquid 32 charged into the recess 22 rises to be higher than the upper surface of the base material 2 in accordance with the surface tension. In this procedure, as shown in FIG. 8C, when the liquid 32 is solidified, the protruding bumps 13 are formed on the recesses 22 by the solidified conductive material 30. Therefore, it is unnecessary to perform any special step in order to form the bumps 13 after forming the conductive pattern 3. Therefore, the production steps can be simplified while reliably connecting the connecting terminals 12 and the driver IC 4 by the aid of the bumps 13.

Sixth Modified Embodiment

Figure 9A:
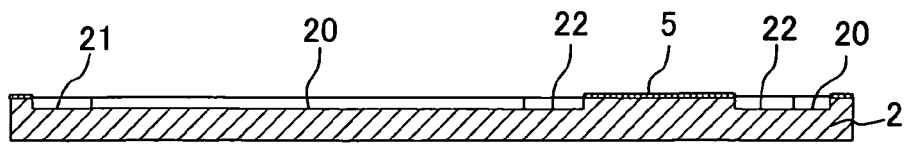
Figure 9B:
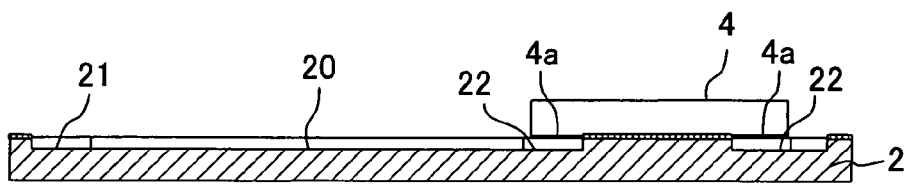
Figure 9C:
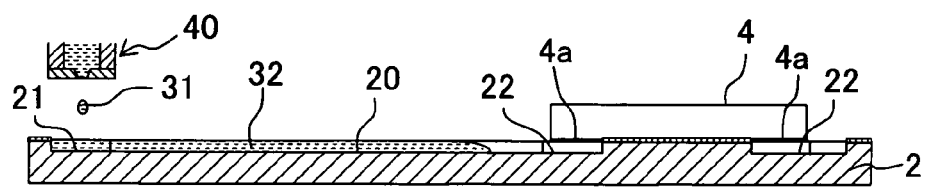
Figure 9D:
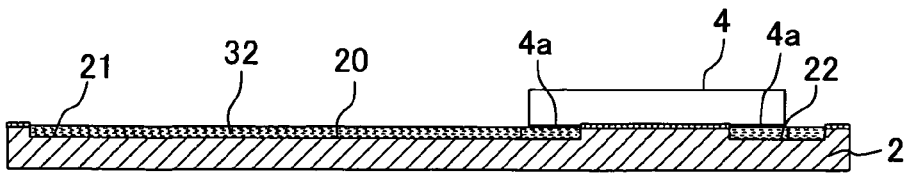

The grooves 20 and the recesses 21, 22 may be formed on the upper surface of the base material 2, and then the driver IC 4 may be installed onto the upper surface of the base material 2, after which the liquid 32 may be charged into the grooves 20. That is, at first, as shown in FIG. 9A, the grooves 20 and the recesses 21, 22 are formed on the upper surface of the base material 2 (recess-forming step). Subsequently, as shown in FIG. 9B, the driver IC 4 is placed on the upper surface of the base material 2 so that the respective terminals 4a are overlapped with the recesses 22 positioned at the right ends of the respective grooves 20 as viewed in a plan view (electronic part-installing step). As shown in FIG. 9C, the liquid droplets 31 are landed on the recesses 21 positioned at the left ends of the respective grooves 20 to allow the liquid 32 to flow from the recesses 21 into the grooves 20. As shown in FIG. 9D, the liquid 32 is charged until arrival at the recesses 22 disposed at the right ends, and the liquid 32 makes contact with the respective terminals 4a disposed on the lower surface of the driver IC 4. In other words, the terminal 4a of the driver IC 4 can be connected to the connecting terminals 12 on the recesses 22 disposed on one side, by merely charging the liquid 32 into the grooves 20 and solidifying the liquid 32. It is unnecessary that the driver IC 4 is pressed against the base material 2 in order to connect the terminals 4a of the driver IC 4 and the connecting terminals 12 of the conductive pattern 3 to one another when the driver IC 4 is installed onto the base material 2. Therefore, there is no fear of the damage of the driver IC 4 and the base material 2. In this modified embodiment, the portions, at which the respective terminals 4a of the driver IC 4 are overlapped as viewed in a plan view, are not limited to the recesses 22 which are positioned at the ends of the respective grooves 20. Each of the portions may be a part of each of the grooves 20. Alternatively, an expanded portion, at which the width is partially enlarged, may be formed at an intermediate part of each of the grooves 20, and the expanded portion may be overlapped with each of the terminals 4a.

Seventh Modified Embodiment

Figure 10:
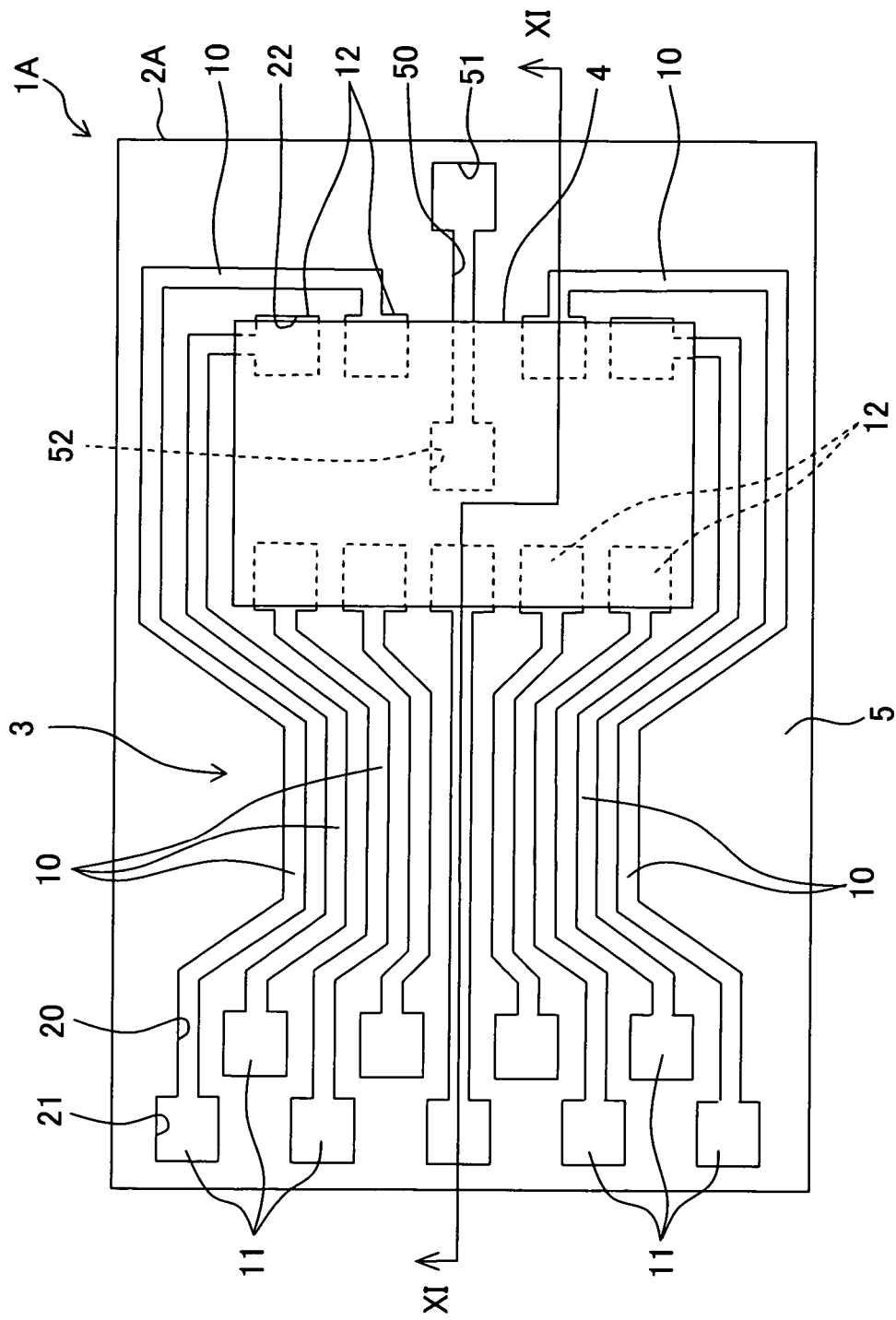
FIG. 10 shows a plan view illustrating a board according to a seventh modified embodiment.
Figure 11:
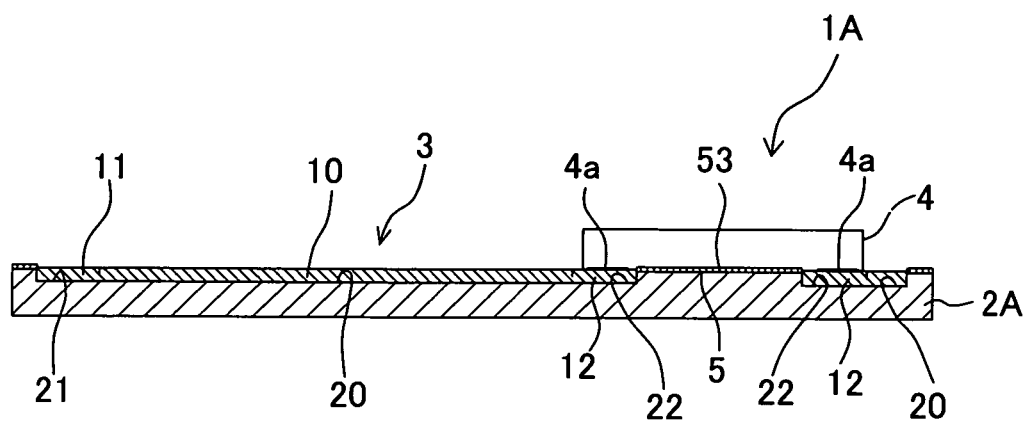
FIG. 11 shows a sectional view taken along a line XI-XI shown in FIG. 10.

In this modified embodiment, a groove 50 for an adhesive and two recesses 51, 52 communicated with the groove 50 are further formed on an upper surface of a base material 2A in the recess-forming step of the sixth modified embodiment (see FIG. 10), which are used to fix the driver IC 4 and a board 1A by means of the adhesive. After the recess-forming step, liquid droplets of the adhesive are landed on one recess 51 positioned at the right end of the base material 2A. Accordingly, the adhesive 53 is charged into the groove 50 and the other recess 52 positioned at the left end of the base material 2A (see FIG. 11). The adhesive 53, which is charged into the recess 52, is used to join the lower surface of the driver IC 4 to the base material 2A. In the case of the board 1A, as shown in FIG. 11, the lower surface of the driver IC 4 and the upper surface of the base material 2A are joined to one another by means of the adhesive 53. In this state, the terminals 4a of the driver IC 4 are thereafter connected to the conductive pattern 3 by means of the conductive material 30 charged into the recesses 22. Therefore, the reliability of the electric connection is enhanced. The recess 52, which is used to supply the adhesive 53 to the space between the upper surface of the base material 2A and the lower surface of the driver IC 4, is necessarily formed in the area which is overlapped with the driver IC 4 as viewed in a plan view. However, in order to obtain the further reliable joining between the driver IC 4 and the base material 2A, it is preferable that the recess 52 is formed in the area which is overlapped with the central portion of the driver IC 4 as shown in FIG. 10.

Eighth Modified Embodiment

Figure 12:
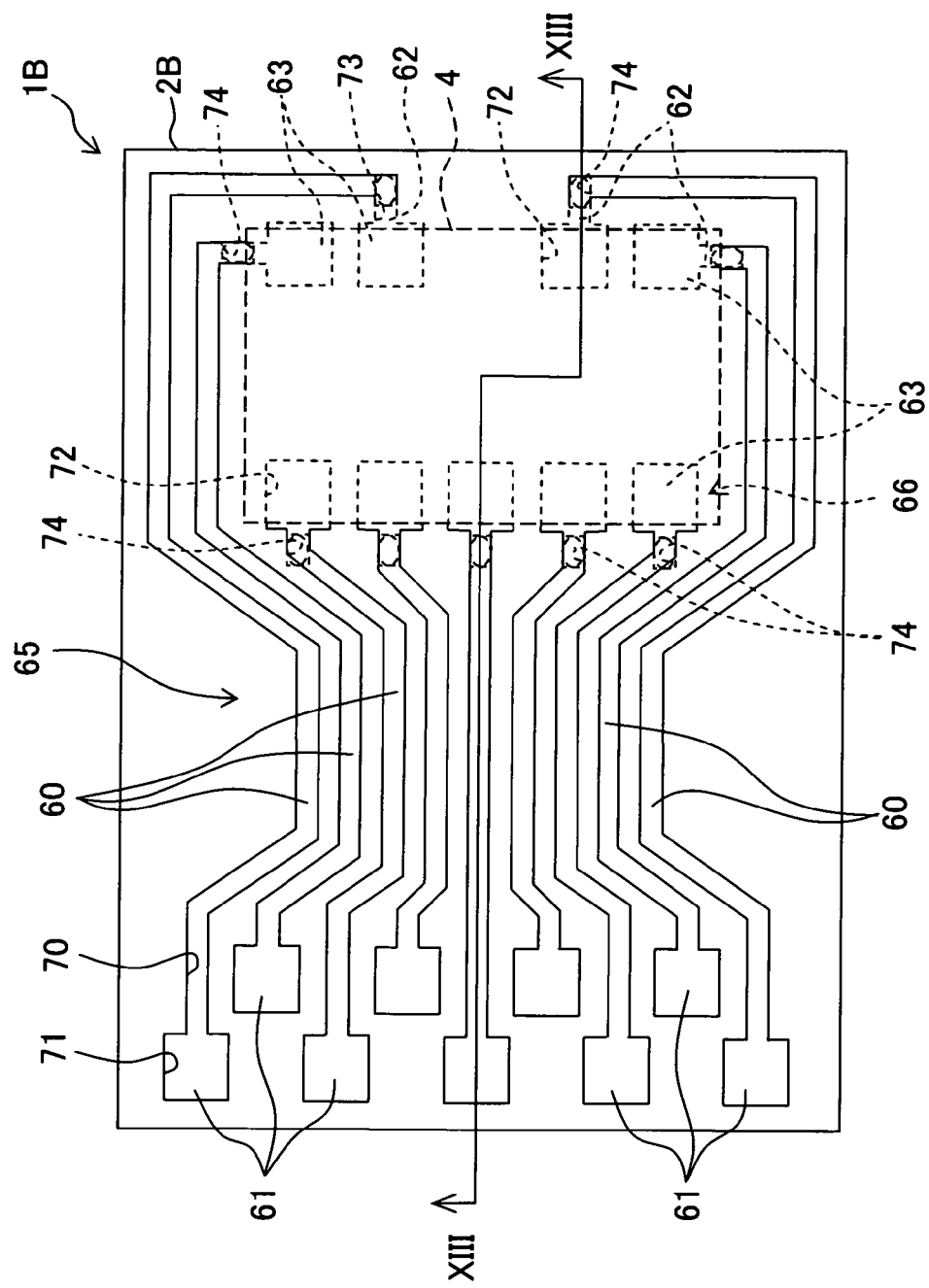
FIG. 12 shows a plan view illustrating a board according to an eighth modified embodiment.
Figure 13:
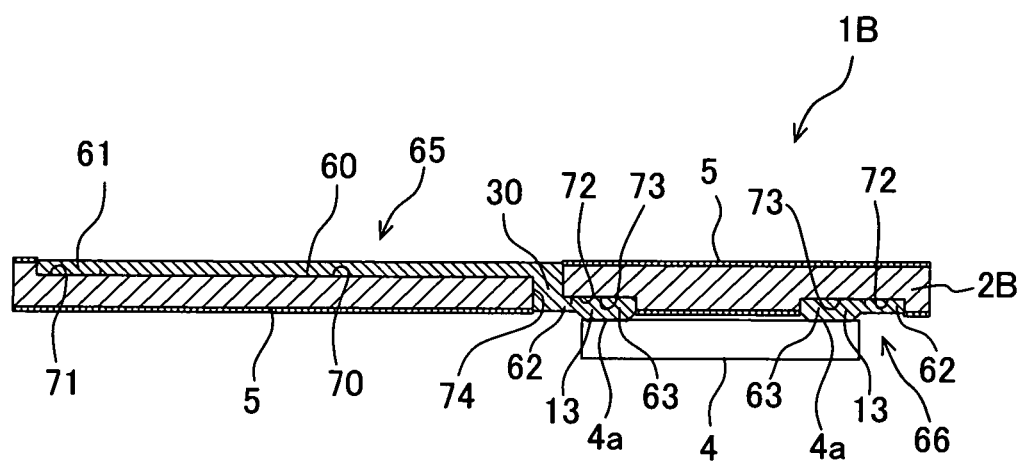
FIG. 13 shows a sectional view taken along a line XIII-XIII shown in FIG. 12.

Conductive patterns, which have fine widths and pitches as shown in FIGS. 12 and 13, can be also formed on both of an upper surface and a lower surface of a base material 2B. The conductive pattern 65, which includes a plurality of wiring sections 60 and a plurality of connecting terminals 61 each provided at one end of each of the plurality of wiring sections 60, is formed on the upper surface of a board 1B. The conductive pattern 66, which includes a plurality of wiring sections 62 and a plurality of connecting terminals 63 each provided at one end of each of the plurality of wiring sections 62, is also formed on the lower surface of the base material 2B. The ends of the wiring sections 60 disposed on the side opposite to the connecting terminals 61 and the ends of the wiring sections 62 disposed on the side opposite to the connecting terminals 63 are connected to one another by the conductive material 30 charged into a plurality of communication holes 74 which penetrate through the base material 2B. The driver IC 4 is installed on the lower surface of the base material 2B. The plurality of terminals 4a of the driver IC 4 are connected to the plurality of connecting terminals 63 formed on the lower surface of the base material 2B.

Figure 14A:
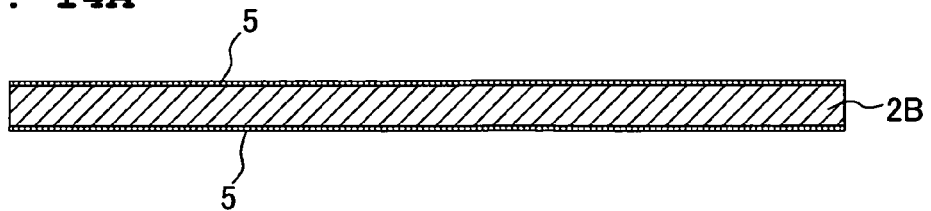
Figure 14B:
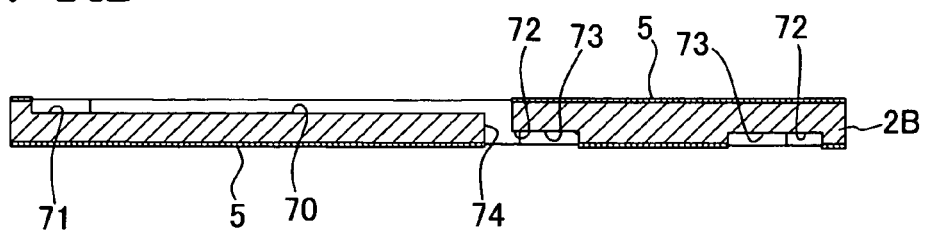

A method for producing the board 1B will be explained principally with reference to FIGS. 14A to 14E. At first, as shown in FIG. 14A, liquid-repellent films 5, each of which is composed of a fluorine-based resin, are formed on the both surfaces of the base material 2B, for example, by means of the spin coat (liquid-repellent film-forming step). Subsequently, as shown in FIG. 14B, a plurality of grooves 70 and a plurality of recesses 71 are formed on the upper surface of the base material 2B, and a plurality of grooves 72 (second grooves) and a plurality of recesses 73 (second recesses) are formed on the lower surface of the base material 2B (recess-forming step). Simultaneously, the plurality of communication holes 74, which make mutual communication between the plurality of grooves 70 disposed on the upper surface of the base material 2B and the plurality of grooves 72 disposed on the lower surface, are also formed. In this arrangement, the plurality of grooves 70 and the plurality of recesses 71 correspond to the plurality of wiring sections 60 and the plurality of connecting terminals 61 of the conductive pattern 65, and the plurality of grooves 72 and the plurality of recesses 73 correspond to the plurality of wiring sections 62 and the plurality of connecting terminals 63 of the conductive pattern 66. The grooves 70, 72, the recesses 71, 73, and the communication holes 74 can be formed, for example, by means of the laser processing. The plurality of grooves 70, 72 are formed to have a narrow width and a narrow pitch (for example, about 20 μm). The recess 71 disposed on the upper surface of the base material 2B is formed so that the width and the length thereof are larger than the width of the groove 70. Further, the recess 73 disposed on the lower surface of the base material 2B is formed so that the width and the length thereof are larger than the width of the groove 72.

Figure 14C:
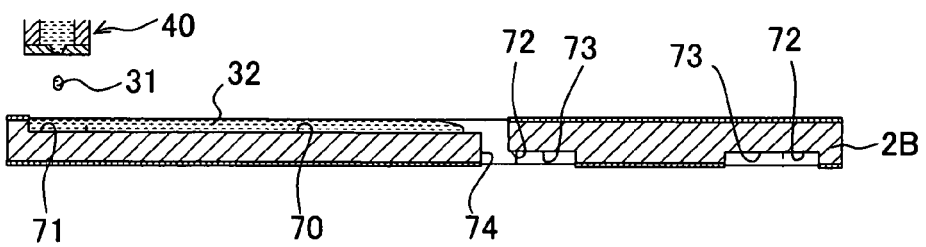
Figure 14D:
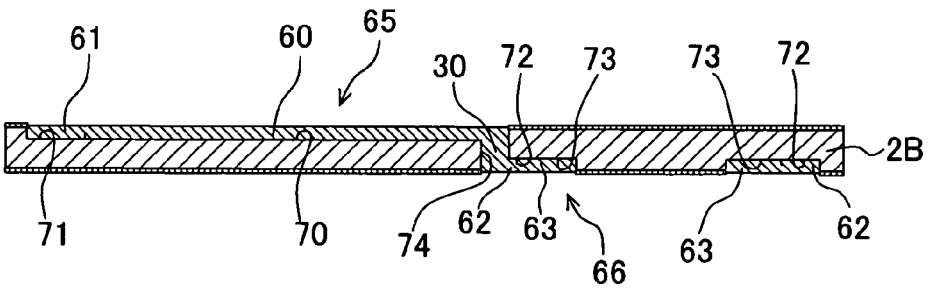
Figure 14E:
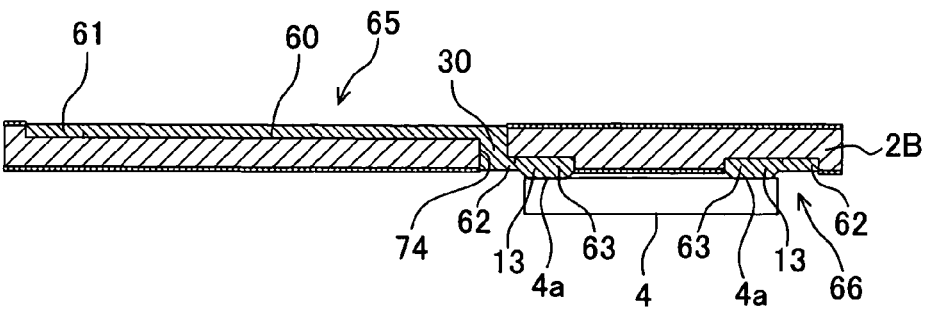

Subsequently, as shown in FIG. 14C, the liquid droplets 31 are landed on the recesses 71 formed on the upper surface of the base material 2B to charge the liquid 32 from the recesses 71 to the recesses 73 via the grooves 70 disposed on the upper surface of the base material 2B, the communication holes 74, and the grooves 72 disposed on the lower surface of the base material 2B (liquid-charging step). Alternatively, the liquid droplets 31 may be landed on both of the recesses 71 disposed on the upper surface of the base material 2B and the recesses 73 disposed on the lower surface. In this procedure, the liquid 32 can be charged into the grooves 70, 72 quickly. The liquid 32, which is charged into the grooves 70, 72, the recesses 71, 73, and the communication holes 74, is solidified (solidifying step) (see FIG. 14D). Accordingly, it is possible to easily form the conductive pattern which has such a complicated shape that the conductive pattern 65 disposed on the upper surface of the base material 2B is connected to the conductive pattern 66 disposed on the lower surface by the conductive material 30 charged into the communication holes 74 which penetrate through the base material 2B. Finally, as shown in FIG. 14E, the bumps 13 are formed on the surface of the conductive material 30 charged into the recesses 73 disposed on the lower surface of the base material 2B, and the driver IC 4 is installed on the lower surface of the base material 2B.

According to this modified embodiment, it is possible to form the conductive pattern having such a complicated shape that the two conductive patterns 65, 66, which are formed on the both surfaces of the base material 2B respectively, are connected to one another by the conductive material 30 charged into the communication holes 74 which penetrate through the base material 2B, while providing the fine width and the fine pitch. In this modified embodiment, the driver IC 4 is connected to only the lower surface of the base material 2B. However, any electronic part such as IC may be also installed on the upper surface of the base material 2B, which may be connected to the connecting terminals 61 disposed on the upper surface. In this arrangement, the plurality of electronic parts can be arranged at a higher density on the base material 2B.

It is not necessarily indispensable that the shape of the recess in a plan view is rectangular. On condition that the areal size, which makes it possible to reliably land the liquid droplets, can be secured, the recess may be formed to have a variety of shapes including, for example, circular, elliptical, and polygonal shapes. That is, the shape of the recess in a plan view may be any one provided that the recess is formed so that the circle, which inscribes the recess, is larger than the circle which is obtained by projecting the liquid droplet to the base material before being landed.

It is unnecessary that the recess 22, on which the liquid droplet 31 is not landed, is formed to have a large areal size equivalent to that of the recess 21 on which the liquid droplet 31 is landed, on condition that the connection can be made, for example, between the driver IC 4 and the conductive pattern 3. Further, the recess 22 may be omitted, and the width of the end of the groove 20 may be the same as that of the groove 20 as well.

It is not necessarily indispensable that the plurality of grooves correspond to the plurality of recesses one by one. At least parts (not less than two) of the plurality of grooves may be communicated with one common recess. In this case, when the liquid droplets are landed on the recess, the liquid is charged from the recess into the plurality of grooves. It is possible to form a conductive pattern having a plurality of wiring sections branched from one connecting terminal.

Ninth Modified Embodiment

In this modified embodiment, a portion (liquid-receiving section), on which the conductive liquid is landed, is flat. That is, the portion has the same height as that of the other surface portions of the base material except for the groove. The liquid repellence of the surface of the liquid-receiving section is lower than the liquid repellence of the other portions of the base material surface. A board 101 shown in FIGS. 15 and 16 has the same structure as that of the board 1 of the first embodiment except that one liquid-receiving section 121 and one groove are provided, and the liquid-receiving section 121 is not the recess.

Figure 15:
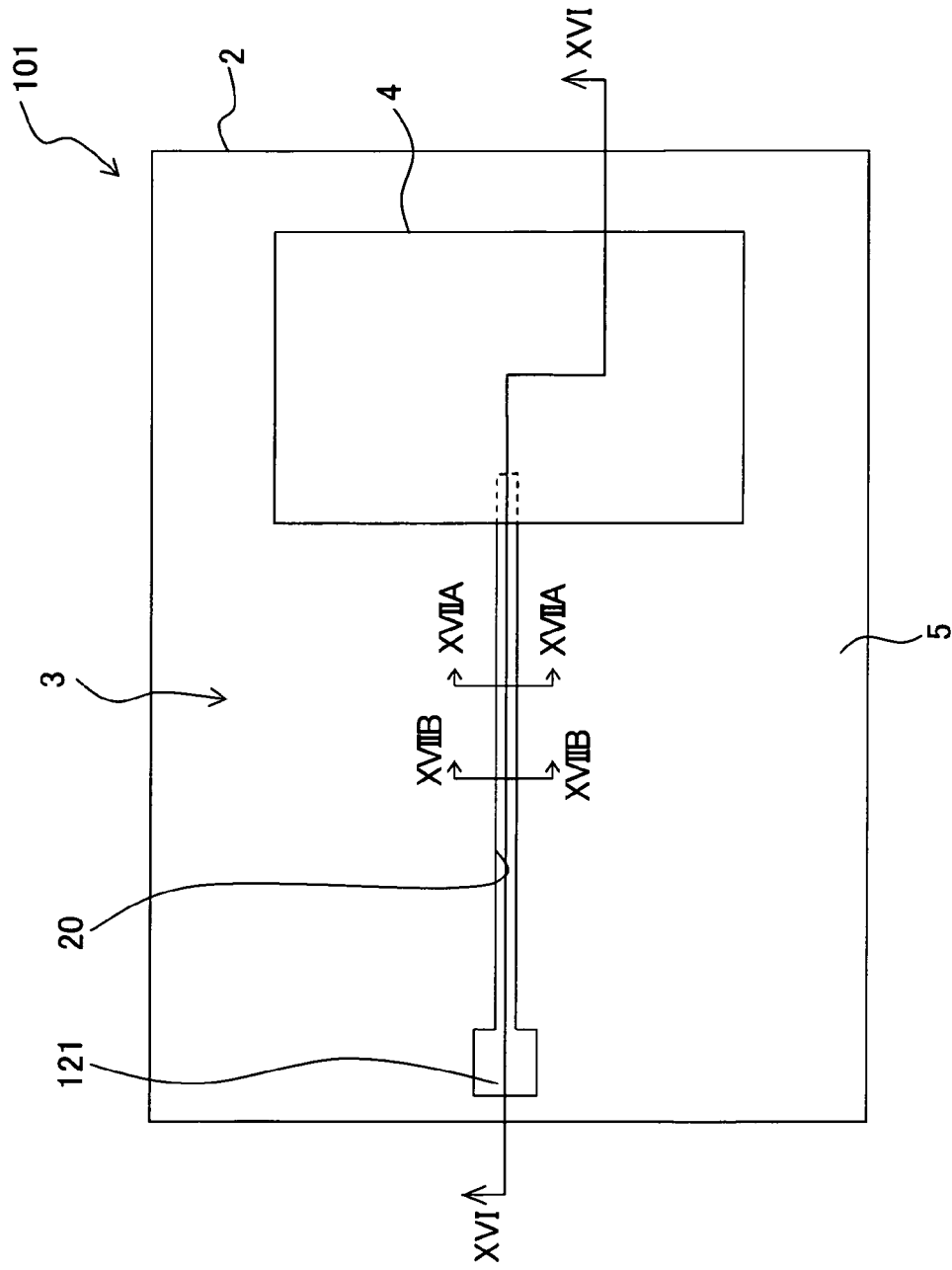
FIG. 15 shows a plan view illustrating a board according to a tenth modified embodiment.
Figure 16:
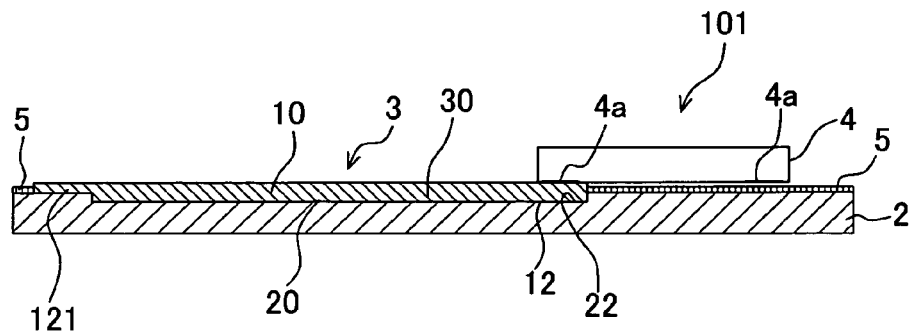
FIG. 16 shows a sectional view taken along a line XVI-XVI shown in FIG. 15.

As shown in FIG. 15, the liquid-receiving section 121 has the same shape as that of the recess 21 of the first embodiment as viewed in a plan view. However, the liquid-receiving section 121 is not formed as the recess. That is, the thickness of the base material 2 in the area in which the liquid-receiving section 121 is formed is the same as the thickness of the base material 2 in other areas except for the groove 20. The liquid-repellent film 5 is applied to the substantially entire upper surface of the base material 2. However, the liquid-repellent film 5 is not formed on the liquid-receiving section 121. The liquid-receiving section 121 as described above can be formed, for example, such that the liquid-repellent film 5 is applied to the entire upper surface of the base material 2, and then the laser is radiated at a weak power to remove the liquid-repellent film 5. Alternatively, the liquid repellence of the surface of the liquid-receiving section 121 can be also lowered by applying a liquid-attractive coating on the surface of the liquid-receiving section 121 even without removing the liquid-repellent film 5. Even when the liquid-receiving section 121, which has the liquid repellence lower than that of the surrounding area, is formed as described above, then the conductive liquid, which is landed on the liquid-receiving section 121, does not outflow to the surrounding area having the high liquid repellence, and the liquid flows along the groove 20 in accordance with the capillary force.

In this modified embodiment, it is enough that the liquid repellence of the surface of the liquid-receiving section is lower than the liquid repellence of the surface of the area disposed around the liquid-receiving section. The shape and the dimension of the liquid-receiving section may be arbitrary. The method for forming no liquid-repellent film 5 on the liquid-receiving section 121 is not limited to the removal of the liquid-repellent film by radiating the laser. For example, the liquid-repellent film may be formed on only a desired portion of the surface of the base material 2 by using a mask. In this modified embodiment, one liquid-receiving section and one groove are formed on the base material. However, the number and the arrangement of each of the liquid-receiving section and the groove may be arbitrary.

Tenth Modified Embodiment

Figure 17A:
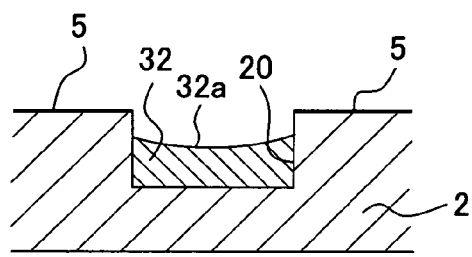
FIG. 17A shows a sectional view taken along a line XVIIA-XVIIA shown in FIG. 15, illustrating a state in which a small amount of the liquid is charged into the groove.
Figure 17B:
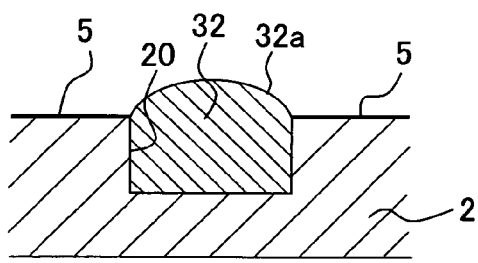
FIG. 17B shows a sectional view taken along a line XVIIB-XVIIB shown in FIG. 15, illustrating a state in which a large amount of the liquid is charged into the groove.

As shown in FIGS. 17A and 17B, the liquid surface 32a of the conductive liquid 32 charged into the groove 20 may be disposed at a position lower than that of the upper opening of the groove 20. Alternatively, the liquid surface 32a may rise to be higher than the upper opening of the groove 20. When the amount of the liquid 32 charged into the groove 20 is smaller than the volume of the groove 20, the liquid surface 32a is disposed at a position lower than the opening of the groove 20. In this situation, the liquid surface 32a has such a shape that the central portion of the groove is depressed as compared with the wall surface sides for defining the groove 20. The conductive pattern, which is formed as described above, does not protrude from the surface of the base material 2, which is protected at the inside of the groove. Therefore, there is little fear of the disconnection of the wiring or the like. On the other hand, when the amount of the liquid 32 charged into the groove 20 is larger than the volume of the groove 20, the liquid surface 32a has such a shape that the liquid surface 32a rises to be higher than the opening of the groove 20, for the following reason. That is, the liquid-repellent film 5 is formed on the surface of the base material 2 disposed outside the groove 20, and hence the liquid 32 is suppressed from the overflow and the spread from the groove 20. The conductive pattern formed as described above protrudes from the surface of the base material 2. Therefore, the conductive pattern can be used as the bump when the connection is made to the electric element such as IC.

Second Embodiment

Figure 18:
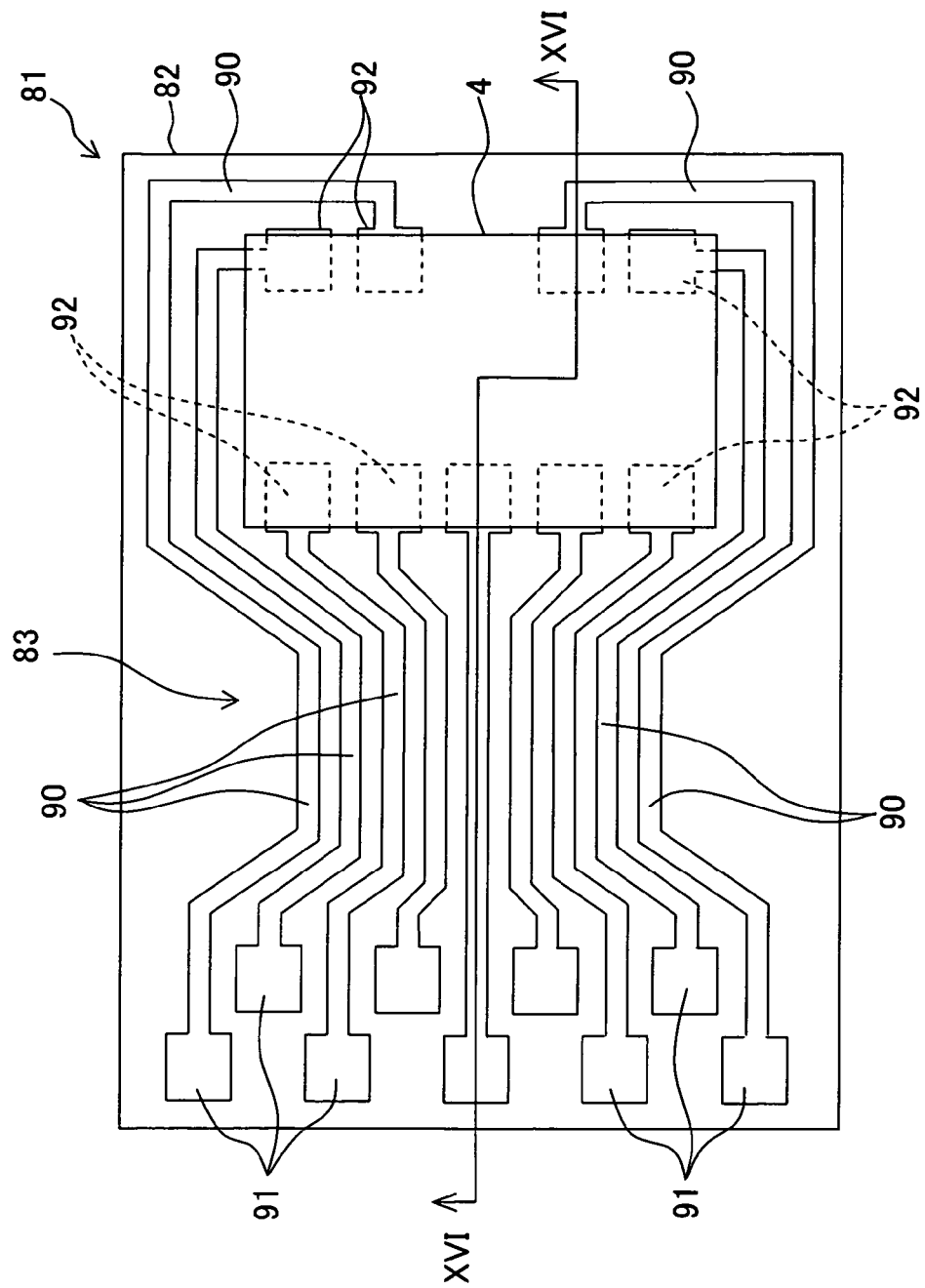
FIG. 18 shows a plan view illustrating a board according to a second embodiment.
Figure 19:
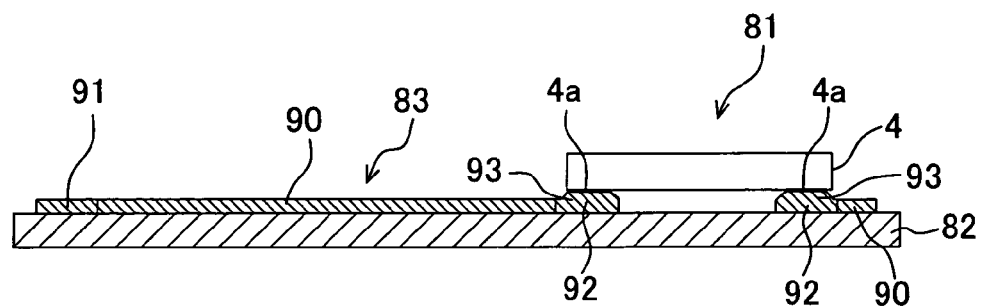
FIG. 19 shows a sectional view taken along a line XVI-XVI shown in FIG. 18.

Next, a second embodiment of the present invention will be explained. As shown in FIG. 18, a board 81 of the second embodiment has a base material 82, and a conductive pattern 83 which is formed on the upper surface of the base material 82. The conductive pattern 83 includes a plurality of wiring sections 90, and connecting terminals 91, 92 which are provided at both ends of the wiring sections 90. The conductive pattern 83 has the same shape in a plan view as that of the conductive pattern 3 of the first embodiment (see FIG. 1). However, as shown in FIG. 19, the conductive pattern 83 differs in that the conductive pattern 83 is formed to protrude from the base material 82. The other arrangement of the board 81 is approximately the same as that of the first embodiment. Any explanation about the arrangement will be omitted. A method for producing the board 81 will be explained below with reference to FIGS. 20A to 20H.

Figure 20A:
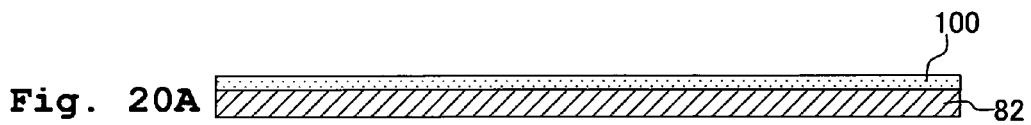

At first, as shown in FIG. 20A, a resist layer 100, which is composed of a thermoplastic resin such as PMMA (polymethyl methacrylate), is formed on the upper surface of the base material 82 which is composed of an insulating material including, for example, a flexible synthetic resin material such as polyimide resin, aramid resin, phenol resin, and liquid crystal polymer, and a ceramic material having high rigidity such as alumina and zirconia (resist layer-forming step).

Figure 20B:
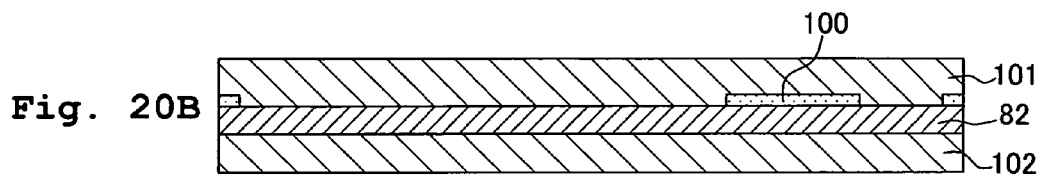
Figure 20C:
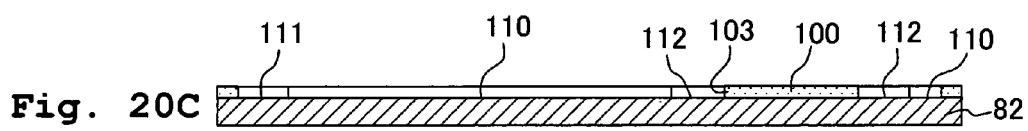

Subsequently, as shown in FIG. 20B, the base material 82 (resist layer 100) is heated to a softening temperature of the resist layer (for example, about 200° C.), and then the base material 82 is interposed by molds 101, 102 on the both upper and lower sides. The mold 101, which has the lower surface formed to have a concave/convex shape, is pressed against the softened resist layer 100. The resist layer 100 is cooled and cured, and then the molds 101, 102 are detached from the base material 82. Accordingly, as shown in FIG. 20C, through-holes 103, which arrive at the upper surface of the base material 82, are formed through the resist layer 100. In other words, a plurality of grooves 110 and a plurality of recesses 111, 112, which correspond to the conductive pattern 83, are formed by forming the through-holes 103 of the resist layer 100 on the upper surface the base material 82 (recess-forming step).

Figure 20D:
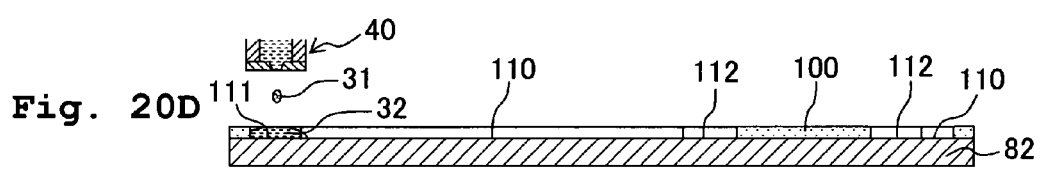
Figure 20E:
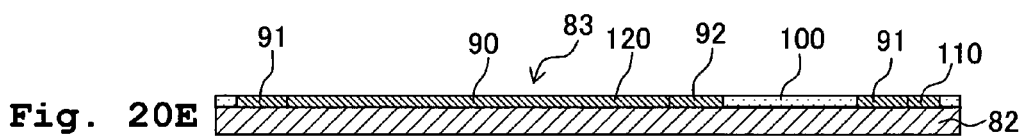
Figure 20F:
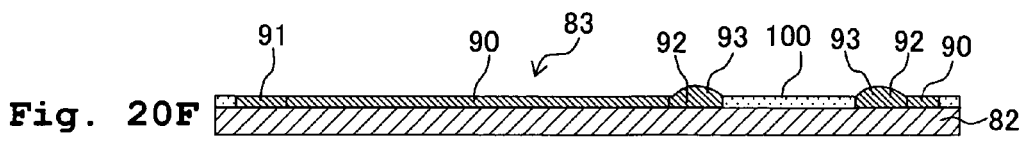

Subsequently, as shown in FIG. 20D, conductive liquid droplets 31, which are composed of, for example, a conductive nanoparticle ink, are jetted from a liquid droplet-jetting unit 40 such as an ink-jet head or a microdispenser. The liquid droplets 31 are landed on the recess 111 disposed on the left side, of the recesses 111, 112 communicated with the groove 110 to charge the conductive liquid 32 from the groove 110 to the recess 112 disposed at the right end (liquid-charging step). When the conductive liquid 32, which is charged into the plurality of grooves 110 and the plurality of recesses 111, 112, is solidified (solidifying step), the conductive pattern 83 is formed by the solidified conductive material 120. In this embodiment, for example, when the liquid 32 is the conductive nanoparticle ink, the liquid 32 is solidified by heating the liquid 32 to a predetermined temperature (about 200° C.). Further, as shown in FIG. 20F, bumps 93 are formed, for example, by landing a small amount of the conductive liquid droplets on the surface of the conductive material 120 charged into the recesses 112 disposed at the right end (bump-forming step).

Figure 20G:
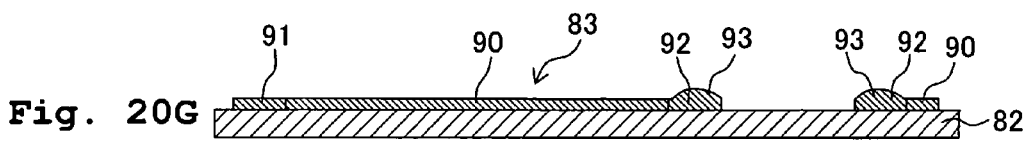
Figure 20H:
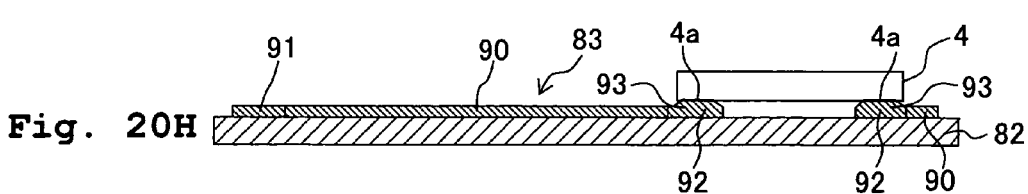

As shown in FIG. 20G, when the remaining resist layer 100 is removed (resist layer-removing step), the conductive pattern 83 is formed to have such a shape that the conductive pattern 83 protrudes from the upper surface of the base material 82. Further, as shown in FIG. 20H, the driver IC 4 is installed on the bumps 93, and the terminals 4a of the driver IC 4 are connected to the conductive pattern 83 by the aid of the bumps 93.

In the second embodiment, the fine conductive pattern 83 can be easily formed on the base material 82 in the same manner as in the first embodiment. It is possible to reduce the production cost as well. Additionally, the conductive pattern 83, which has the shape to protrude from the base material 82, can be easily formed. The same modifications as those applied to the first embodiment can be also applied to the second embodiment, for example, in relation to the shapes of the groove and the recess and the method for forming the bump.

In the embodiments and the modified embodiments described above, the depth of the groove is uniform, and the cross-sectional shape of the groove is substantially rectangular. However, the cross-sectional shape of the groove may be arbitrary. For example, the cross-sectional shape of the groove may be, for example, semicircular and triangular shapes. In the embodiments and the modified embodiments described above, it is also allowable that the width of the groove is not uniform. For example, a part of the groove may be formed to have a wide width.

The first embodiment and the second embodiment explained above are illustrative of the exemplary cases in which the present invention is applied when the conductive pattern is formed at the fine width and the fine pitch on the base material. However, the present invention is also applicable to those other than the forms as described above. For example, the present invention is also applicable to a case in which optical waveguide paths are formed at a fine width and a fine pitch on a base material. In this case, a plurality of grooves and recesses communicated with the plurality of grooves are formed on a surface of the transparent base material having a low refractive index. Liquid droplets of a transparent resin are landed on the recesses, the transparent resin including, for example, UV-curable resins such as epoxy resins, and thermoplastic resin such as fluorine-based resins and fluorene-based resins. Accordingly, the resin is charged into the grooves. Thus, the optical waveguide paths, which have the refractive index higher than that of the base material, can be formed on the surface of the base material.

What is claimed is:

1. A method for forming a pattern on a board, comprising:
a step of providing a base material for forming the board;
a step of forming a first groove and a first liquid receiving section communicated with the first groove, on one surface of the base material;
a step of applying a processing for lowering a liquid repellent property of the surface of the base material at a portion defining an entire exposed surface of the first groove by irradiating with a laser the portion defining the entire exposed surface of the first groove;
a step of arranging a liquid droplet jetting unit above the one surface of the base material and jetting liquid droplets, which are conductive and include a conductive material, from the liquid droplet jetting unit toward the base material;
a liquid charging step of charging, via capillary action, the conductive liquid into the first groove communicated with the first liquid receiving section by landing the liquid droplets jetted from the liquid droplet jetting unit on the first liquid receiving section; and
a solidifying step of solidifying the conductive liquid charged into the first groove,
wherein the first liquid-receiving section has such a size that a circle, which has the same diameter as a diameter of the liquid droplet before landing on the first liquid receiving section, is completely included in the first liquid-receiving section, and the first groove has a width which is less than the diameter of the liquid droplet.

2. The method for forming the pattern according to claim 1, wherein liquid repellence of the one surface of the base material is greater than liquid repellence of a surface for defining the first groove and the first liquid receiving section.

3. The method for forming the pattern according to claim 2, further comprising a liquid repellent film forming step of forming a liquid repellent film which has liquid repellence higher than the liquid repellence of a surface for defining the first groove and the first liquid receiving section, the liquid repellent film being formed on the one surface of the base material, and the liquid repellent film forming step being performed before the step of forming the first groove and the first liquid receiving section.

4. The method for forming the pattern according to claim 3, wherein the liquid repellent film is formed of a fluorine based resin.

5. The method for forming the pattern according to claim 1, further comprising:
an electronic part installing step of installing an electronic part on the one surface of the base material, the electronic part installing step being performed between the step of forming the first groove and the first liquid receiving section and the liquid charging step, wherein:
the electronic part is installed in the electronic part installing step so that a terminal of the electronic part is overlapped with the first groove.

6. The method for forming the pattern according to claim 1, further comprising a bump forming step of forming a protruding bump by further landing conductive liquid droplets on a surface of the conductive material solidified on the first liquid receiving section after the solidifying step.

7. The method for forming the pattern according to claim 1, wherein the liquid is landed on the first liquid receiving section until a liquid surface of the liquid rises to be greater than the one surface of the base material in the liquid charging step.

8. The method for forming the pattern according to claim 1, wherein:
the first liquid receiving section includes two landing sections, and the two landing sections are formed at both ends of the first groove respectively in the step of forming the first groove and the first liquid receiving section; and
the liquid droplets are landed on the two landing sections respectively in the liquid charging step.

9. The method for forming the pattern according to claim 1, wherein:
a second groove is formed on the other surface of the base material, and a communication hole, which penetrates through the base material and which makes mutual communication between the first groove formed on the one surface and the second groove formed on the other surface, is formed in the step of forming the first groove and the first liquid receiving section; and the liquid is charged into the first groove, and the liquid is also charged into the second groove via the communication hole in the liquid charging step.

10. The method for forming the pattern according to claim 9, wherein a second liquid receiving section, which makes communication with the second groove, is formed on the other surface of the base material in the step of forming the first groove and the first liquid receiving section.

11. The method for forming the pattern according to claim 1, further comprising:
- a resist layer-forming step of forming a resist layer on the one surface of the base material, the resist layer-forming step being performed before the step of forming the first groove and the first liquid-receiving section, wherein:
- a through-hole, which arrives at the one surface of the base material, is formed through the resist layer, and thus the first groove and the first liquid-receiving section are formed in the step of forming the first groove and the first liquid-receiving section, and the method further comprises:
- a resist layer-removing step of removing the resist layer after solidifying the liquid in the solidifying step after charging the liquid into the first groove in the liquid-charging step.

12. The method for forming the pattern according to claim 1, wherein the first groove and the first liquid receiving section are formed by means of laser processing in the step of forming the first groove and the first liquid receiving section.

13. The method for forming the pattern according to claim 1, wherein the first groove includes a plurality of grooves, and the first liquid receiving section includes a plurality of liquid receiving sections.

14. The method for forming the pattern according to claim 1, wherein the first groove has a width less than or equal to 20 µm.

15. The method for forming the pattern according to claim 1, wherein the liquid is a conductive nanoparticle ink containing nanoparticles of silver or gold.

16. The method for forming the pattern according to claim 1, wherein the liquid is an adhesive.

17. The method for forming the pattern according to claim 1, wherein a width and a length of the first liquid receiving section are greater than a width of the first groove.

18. The method for forming the pattern according to claim 10, wherein a width and a length of the second liquid receiving section are greater than a width of the second groove.

19. The method for forming the pattern according to claim 5, wherein the liquid is landed until the electronic part makes contact with a surface of the liquid in the liquid charging step.

20. The method for forming the pattern according to claim 1,
wherein the step of forming further comprises forming a base of the first groove to be at a height different from a height of the one surface of the base material and a height of a base of the first liquid receiving section.

\* \* \* \* \*